US008566756B2

(12) United States Patent
Okita

(10) Patent No.: US 8,566,756 B2
(45) Date of Patent: Oct. 22, 2013

(54) PROCESSING CONDITION DETERMINING METHOD AND APPARATUS, DISPLAY METHOD AND APPARATUS, PROCESSING APPARATUS, MEASUREMENT APPARATUS AND EXPOSURE APPARATUS, SUBSTRATE PROCESSING SYSTEM, AND PROGRAM AND INFORMATION RECORDING MEDIUM

(75) Inventor: Shinichi Okita, Nishitokyo (JP)

(73) Assignee: Nikon Corporation, Tokyo (JP)

( * ) Notice: Subject to any disclaimer, the term of this patent is extended or adjusted under 35 U.S.C. 154(b) by 517 days.

(21) Appl. No.: 12/181,705

(22) Filed: Jul. 29, 2008

(65) Prior Publication Data

US 2008/0294280 A1    Nov. 27, 2008

Related U.S. Application Data

(63) Continuation of application No. PCT/JP2007/051276, filed on Jan. 26, 2007.

(30) Foreign Application Priority Data

Jan. 30, 2006   (JP) ................................ 2006-020214

(51) Int. Cl.
| | | |
|---|---|---|
| G06F 17/50 | (2006.01) | |
| G03F 1/00 | (2012.01) | |
| G03C 5/00 | (2006.01) | |
| G03B 27/68 | (2006.01) | |
| G03B 27/52 | (2006.01) | |
| G03B 27/72 | (2006.01) | |

(52) U.S. Cl.
USPC ................... 716/54; 716/50; 716/51; 716/52; 716/53; 716/55; 430/5; 430/30; 355/52; 355/53; 355/55; 355/71

(58) Field of Classification Search
USPC ............ 716/50–55; 430/5, 30; 355/53, 55, 71
See application file for complete search history.

(56) References Cited

U.S. PATENT DOCUMENTS 5,243,377 A * 9/1993 Umatate et al. .................. 355/53
5,525,808 A * 6/1996 Irie et al. ........................ 250/548

(Continued)

FOREIGN PATENT DOCUMENTS

| JP | 5-36583 | 2/1993 |
| JP | 8-274017 | 10/1996 |

(Continued)

OTHER PUBLICATIONS

International Search Report mailed Mar. 27, 2007, for corresponding International Application No. PCT/JP2007/051276.

(Continued)

*Primary Examiner* — Helen Rossoshek
(74) *Attorney, Agent, or Firm* — Staas & Halsey LLP

(57) ABSTRACT

In a first process, a process A, an actually measured transfer position measured by a measurement/inspection instrument is indicated by a black circle. A targeted transfer position indicated by x in a process B is located at the same position as the black circle. Assuming that the weights in the subsequent processes are the same, a targeted transfer position $X_{target}$ indicated by x in processes C, D and E is located at a moderate position with which the total deviation from an actual transfer position (black circle) measured by the measurement/inspection instrument in a process preceding the current process is minimized, that is, at a proper position with respect to a plurality of other processes. Accordingly, the productivity of devices can be improved.

36 Claims, 8 Drawing Sheets

(56) References Cited

U.S. PATENT DOCUMENTS

| | | | |
|---|---|---|---|
| 5,621,500 A * | 4/1997 | Shiraishi | 355/71 |
| 5,694,325 A * | 12/1997 | Fukuda et al. | 700/121 |
| 6,078,380 A * | 6/2000 | Taniguchi et al. | 355/52 |
| 6,161,054 A * | 12/2000 | Rosenthal et al. | 700/121 |
| 6,514,851 B2 * | 2/2003 | Saito | 438/622 |
| 6,522,386 B1 * | 2/2003 | Nishi | 355/52 |
| 6,538,721 B2 * | 3/2003 | Okita et al. | 355/53 |
| 6,546,543 B1 * | 4/2003 | Manabe et al. | 716/52 |
| 6,620,690 B2 * | 9/2003 | Lee et al. | 438/268 |
| 6,869,739 B1 * | 3/2005 | Ausschnitt et al. | 430/30 |
| 6,912,435 B2 * | 6/2005 | Pellegrini et al. | 700/121 |
| 6,992,751 B2 * | 1/2006 | Okita et al. | 355/53 |
| 7,088,426 B2 * | 8/2006 | Hirukawa et al. | 355/53 |
| 7,232,758 B2 * | 6/2007 | Chen | 438/689 |
| 7,418,694 B2 * | 8/2008 | Kobayashi et al. | 716/50 |
| 7,626,702 B2 * | 12/2009 | Ausschnitt et al. | 356/401 |
| 7,656,529 B1 * | 2/2010 | Nikoonahad | 356/401 |
| 7,691,540 B2 * | 4/2010 | Yamaguchi et al. | 430/5 |
| 7,810,066 B2 * | 10/2010 | Yasuzato | 716/55 |
| 7,873,935 B2 * | 1/2011 | Jung et al. | 378/34 |
| 2002/0021433 A1 * | 2/2002 | Okita et al. | 355/55 |
| 2005/0031975 A1 | 2/2005 | Reuhman-Huisken et al. | |
| 2006/0068301 A1 * | 3/2006 | Hirukawa | 430/5 |
| 2006/0161452 A1 * | 7/2006 | Hess | 705/1 |
| 2007/0050749 A1 * | 3/2007 | Ye et al. | 716/20 |
| 2007/0142950 A1 * | 6/2007 | Okita | 700/108 |
| 2008/0072207 A1 * | 3/2008 | Verma et al. | 716/21 |
| 2008/0106714 A1 * | 5/2008 | Okita | 355/53 |
| 2008/0215295 A1 * | 9/2008 | Shiraishi | 702/187 |
| 2008/0295049 A1 * | 11/2008 | Izuha | 716/5 |
| 2008/0295062 A1 * | 11/2008 | Wu et al. | 716/21 |
| 2008/0320434 A1 * | 12/2008 | Mukai et al. | 716/20 |
| 2010/0035167 A1 * | 2/2010 | Nagai et al. | 430/30 |

FOREIGN PATENT DOCUMENTS

| | | |
|---|---|---|
| JP | 2004-343113 | 2/2004 |
| JP | 2004-228153 | 8/2004 |
| JP | 2004-311773 | 11/2004 |

OTHER PUBLICATIONS

English translation of JP 8-274017, published Oct. 18, 1996.

English abstract and translation of JP 5-36583, published Feb. 12, 1993.

Japanese Patent Office Notification of Reasons for Refusal mailed Feb. 1, 2012, for corresponding Japanese Patent Application No. 2007-556018.

International Search Report mailed Mar. 27, 2007 in correspondence with International Application No. PCT/JP2007/051276.

* cited by examiner

PROCESSING CONDITION DETERMINING METHOD AND APPARATUS, DISPLAY METHOD AND APPARATUS, PROCESSING APPARATUS, MEASUREMENT APPARATUS AND EXPOSURE APPARATUS, SUBSTRATE PROCESSING SYSTEM, AND PROGRAM AND INFORMATION RECORDING MEDIUM

CROSS-REFERENCE TO RELATED APPLICATIONS

This application is a continuation of International Application PCT/JP2007/051276, with an international filing date of Jan. 26, 2007, the disclosure of which is hereby incorporated herein by reference in its entirety, which was not published in English.

BACKGROUND OF THE INVENTION

1. Field of the Invention

The present invention relates to processing condition determining methods and apparatuses, display methods and apparatuses, processing apparatuses, measurement apparatuses and exposure apparatuses, substrate processing systems, and programs and information recording media, and more particularly, to a processing condition determining method and a processing condition determining apparatus that determine a processing condition with respect to a pattern that is formed and layered on an object in each process, a display method and display apparatus that display a processing condition with respect to a pattern that is formed and layered on an object in each process, a processing apparatus that is equipped with the processing condition determining apparatus or the display apparatus, a measurement apparatus and an exposure apparatus, a substrate processing system that is equipped with the processing apparatus, the measurement apparatus, the exposure apparatus and the like, and a program that realizes the processing condition determining method or the display method and an information recording medium that stores the program.

2. Description of the Background Art

In a device manufacturing process in which circuit patterns are overlaid layer by layer on a substrate, overlay accuracy and linewidth accuracy of the circuit pattern of each layer need to be maintained at a high level, and to manage these accuracies appropriately is an important subject. In order to manage the overlay and the linewidth, preceding exposure to a test wafer prior to an actual process, measurement of overlay error and linewidth error in the exposure result, and adjustment of alignment-related parameters and control system parameters related to exposure dose, synchronous accuracy and focus control in an exposure apparatus based on the measurement result were performed in conventional methods.

In general, management of the overlay is performed only using either one of layers that have been formed so far (which is different depending on each coordinate axis in some cases) as a reference, and management of the linewidth is performed independently for each layer. In such a case, a permissible level of overlay error needs to be set extremely strict for every layer so that a device as a whole is prevented from being defective even if transfer positions of device patterns are gradually deviated in one direction as the device patterns are layered. However, under the management described above, despite the fact that a permissible level of overlay error varies from layer to layer, alignment stricter than necessary was performed for layers for which a permissible degree of overlay error was relatively low.

Further, a device pattern of each layer has electrical link with a plurality of layers via a contact hole or the like in many cases, and in such cases, management with respect to either one of the layers is insufficient.

SUMMARY OF THE INVENTION

According to a first aspect of the present invention, there is provided a processing condition determining method of determining a processing condition with respect to each of patterns that are formed and layered on an object in each process, the method comprising: a determination process of determining a processing condition with respect to a pattern of a layer that is subject to processing, based on information on a forming state of a pattern in the process relating to a plurality of layers that has been executed in the past, using an information processor.

With this method, based on information on a forming state of patterns in the process relating to a plurality of layers that has been executed in the past, a processing condition with respect to a pattern of a layer that is subject to processing is determined, and therefore, the pattern of the layer subject to processing can be proper with respect to forming information of the patterns in the process relating to a plurality of layers.

According to a second aspect of the present invention, there is provided a processing condition determining apparatus that determines a processing condition with respect to a pattern that is formed and layered on an object in each process, using the processing condition determining method of the present invention. With this apparatus, because the processing condition is determined using the processing condition determining method of the present invention, the pattern of the layer subject to processing can be proper with respect to forming information of the patterns in the process relating to a plurality of layers.

According to a third aspect of the present invention, there is provided a display method of displaying a processing condition with respect to a pattern that is formed and layered on an object in each process, the method comprising: a display process of displaying information on a processing condition, which has been dynamically changed for each layer with respect to patterns of a plurality of layers already layered on the object, for a plurality of layers, using an information processor.

With this method, information on a processing condition that has been dynamically changed for each layer with respect to a plurality of layers that have already been layered on the object is displayed for a plurality of layers, and therefore, it can be confirmed that the processing condition is proper for a plurality of layers by viewing the display.

According to a fourth aspect of the present invention, there is provided a display apparatus that displays a processing condition with respect to a pattern that is formed and layered on an object in each process, using the display method of the present invention. With this apparatus, since the processing condition is displayed using the display method of the present invention, it can be confirmed that the processing condition is proper for a plurality of layers by viewing the display.

According to a fifth aspect of the present invention, there is provided a first processing apparatus that executes a process of forming a pattern on an object, the apparatus comprising: the processing condition determining apparatus of the present invention. Since this apparatus is equipped with the processing condition determining apparatus of the present invention, determination of processing conditions in which a plurality of layers are taken into consideration can be performed.

According to a sixth aspect of the present invention, there is provided a second processing apparatus that executes a process of forming a pattern on an object, the apparatus comprising: the display apparatus of the present invention. Since this apparatus is equipped with the display apparatus of the present invention, confirmation of processing conditions in which a plurality of layers are taken into consideration can be performed.

According to a seventh aspect of the present invention, there is provided a first measurement apparatus that measures information on a pattern formed on an object, the apparatus comprising: the processing condition determining apparatus of the present invention. Since this apparatus is equipped with the processing condition determining apparatus of the present invention, determination processing conditions in which a plurality of layers are taken into consideration can be performed.

According to an eighth aspect of the present invention, there is provided a second measurement apparatus that measures information on a pattern formed on an object, the apparatus comprising: the display apparatus of the present invention. Since this apparatus is equipped with the display apparatus of the present invention, confirmation of processing conditions in which a plurality of layers are taken into consideration can be performed.

According to a ninth aspect of the present invention, there is provided a first exposure apparatus that transfers a pattern on an object, the apparatus comprising: the processing condition determining apparatus of the present invention. Since this apparatus is equipped with the processing condition determining apparatus of the present invention, determination of processing conditions in which a plurality of layers are taken into consideration can be performed.

According to a tenth aspect of the present invention, there is provided a second exposure apparatus that transfers a pattern on an object, the apparatus comprising: the display apparatus of the present invention. Since this apparatus is equipped with the display apparatus of the present invention, confirmation of processing conditions in which a plurality of layers are taken into consideration can be performed.

According to an eleventh aspect of the present invention, there is provided a first substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the processing condition determining apparatus and executes a process of forming a pattern on an object; a measurement apparatus that comprises the processing condition determining apparatus and measures information on a pattern formed on an object; and an exposure apparatus that comprises the processing condition determining apparatus and transfers a pattern on an object.

According to a twelfth aspect of the present invention, there is provided a second substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the processing condition determining apparatus and executes a process of forming a pattern on an object; a measurement apparatus that comprises the processing condition determining apparatus and measures information on a pattern formed on an object; and an exposure apparatus that comprises the display apparatus and transfers a pattern on an object.

According to a thirteenth aspect of the present invention, there is provided a third substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the processing condition determining apparatus and executes a process of forming a pattern on an object; a measurement apparatus that comprises the display apparatus and measures information on a pattern formed on an object; and an exposure apparatus that comprises the processing condition determining apparatus and transfers a pattern on an object.

According to a fourteenth aspect of the present invention, there is provided a fourth substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the processing condition determining apparatus and executes a process of forming a pattern on an object; a measurement apparatus that comprises the display apparatus and measures information on a pattern formed on an object; and an exposure apparatus that comprises the display apparatus and transfers a pattern on an object.

According to a fifteenth aspect of the present invention, there is provided a fifth substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the display apparatus and executes a process of forming a pattern on an object; a measurement apparatus that comprises the processing condition determining apparatus and measures information on a pattern formed on an object; and an exposure apparatus that comprises the processing condition determining apparatus and transfers a pattern on an object.

According to a sixteenth aspect of the present invention, there is provided a sixth substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the display apparatus and executes a process of forming a pattern on an object; a measurement apparatus that comprises the processing condition determining apparatus and measures information on a pattern formed on an object; and an exposure apparatus that comprises the display apparatus and transfers a pattern on an object.

According to a seventeenth aspect of the present invention, there is provided a seventh substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the display apparatus and executes a process of forming a pattern on an object; a measurement apparatus that comprises the display apparatus and measures information on a pattern formed on an object; and an exposure apparatus that comprises the processing condition determining apparatus and transfers a pattern on an object.

According to an eighteenth aspect of the present invention, there is provided an eighth substrate processing system that executes a series of processes of forming a pattern on an object, the system comprising at least one of: a processing condition determining apparatus that determines a processing condition with respect to a pattern that is formed and layered on an object in each process, using the processing condition determining method of the present invention; a display apparatus that displays a processing condition with respect to a pattern that is formed and layered on an object in each process, using the display method of the present invention; a processing apparatus that comprises the display apparatus and executes a process of forming a pattern on an object; a measurement apparatus that comprises the display apparatus and measures information on a pattern formed on an object; and an exposure apparatus that comprises the display apparatus and transfers a pattern on an object.

Since each of the first to eighth substrate processing systems is equipped with the various apparatuses described above, determination and/or confirmation of processing conditions in which a plurality of layers are taken into consideration can be performed.

According to a nineteenth aspect of the present invention, there is provided a ninth substrate processing system that forms and layers a pattern on an object in each process, the system comprising: a data management section that performs overall management of information on a forming state of a pattern in a process relating to a plurality of layers that has been executed in the past. With such a data management section equipped, overall management of processing conditions relating to a plurality of processes can be performed.

According to a twentieth aspect of the present invention, there is provided a first program that makes a computer execute processing of determining a processing condition with respect to each of patterns that are formed and layered on an object in each process, the program making the computer execute: a determination procedure of determining a processing condition with respect to a pattern of a layer that is subject to processing, based on information on a forming state of a pattern in a process relating to a plurality of layers that has been executed in the past.

With this program, since a processing condition with respect to a pattern of a layer that is subject to processing is determined based on information on a forming state of patterns in the process relating to a plurality of layers that has been executed in the past, the pattern of the layer subject to processing can be proper with respect to a forming state of the patterns in the process relating to a plurality of layers.

According to a twenty-first aspect of the present invention, there is provided a second program that makes a computer execute a procedure of displaying a processing condition with respect to a pattern that is formed and layered on an object in each process, the program making the computer execute: a display procedure of displaying information on a processing condition, which has been dynamically changed for each layer with respect to patterns of a plurality of layers already layered on the object, for a plurality of layers.

With this program, information on a processing condition, which has been dynamically changed for each layer with respect to patterns of a plurality of layers already layered on the object, is displayed for a plurality of layers, and therefore, it can be confirmed that the processing condition is proper for a plurality of layers by viewing the display.

The first and second programs of the present invention can be recorded in an information recording medium that can be read by a computer. Therefore, according to another aspect, it can be said that the present invention is an information recording medium that can be read by a computer in which either of the first or second program is stored.

BRIEF DESCRIPTION OF THE DRAWINGS

In the accompanying drawings.

DESCRIPTION OF THE EMBODIMENTS

An embodiment of the present invention will be described below, referring to FIGS. 1 to 7.

Figure 1:
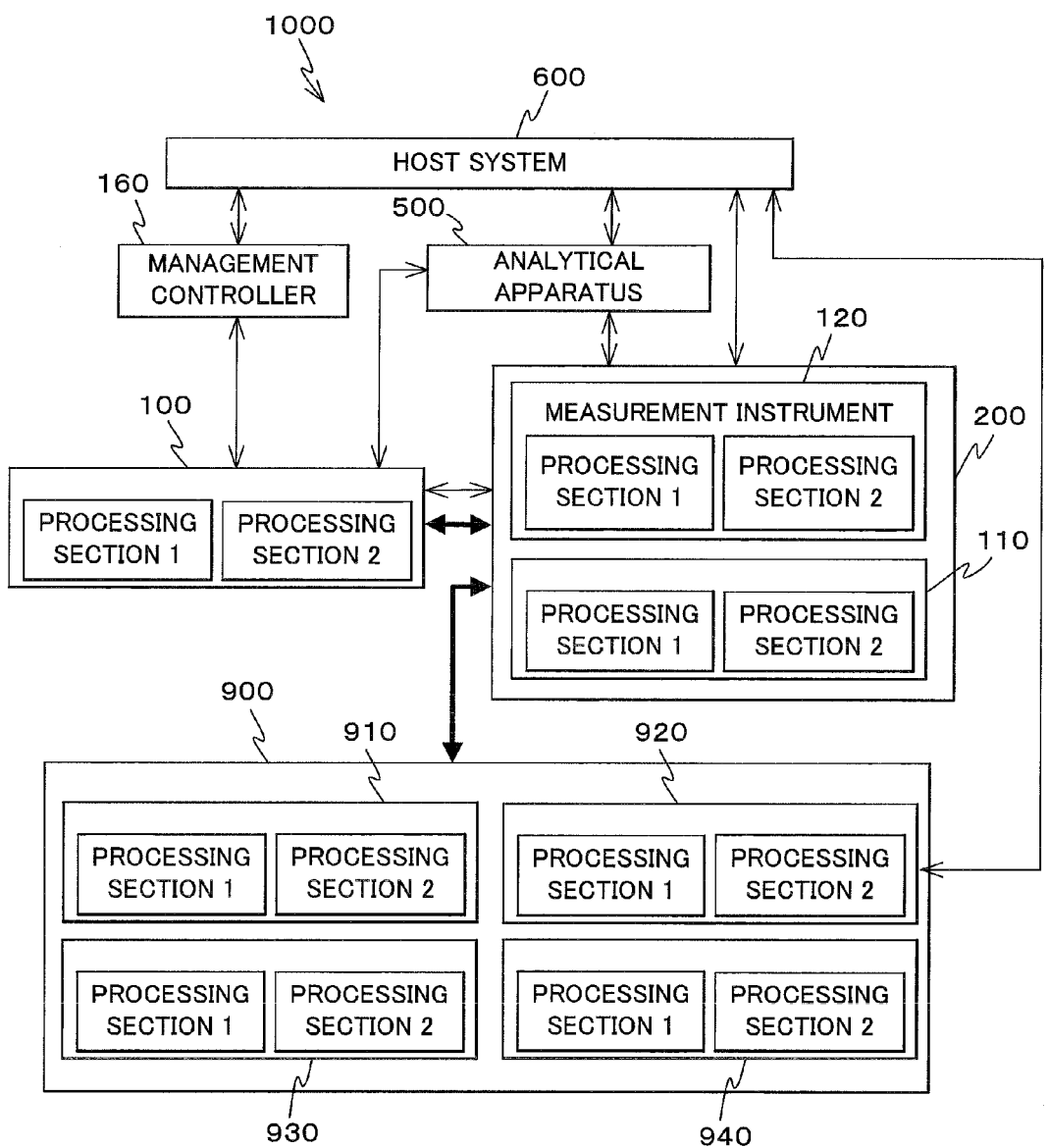
FIG. 1 is a view showing a schematic configuration of a device manufacturing system related to an embodiment of the present invention.

FIG. 1 shows a schematic configuration of a device manufacturing system 1000 to which a processing condition determining method related to the embodiment can suitably be applied. Device manufacturing system 1000 is a system constructed in a device manufacturing plant to process substrates, for example, semiconductor wafers (hereinafter, referred to as "wafers") and manufacture microdevices. As shown in FIG. 1, device manufacturing system 1000 is equipped with an exposure apparatus 100, a track 200 that is placed adjacent to exposure apparatus 100, a management controller 160, an analytical apparatus 500, a host system 600 and a device manufacturing processing apparatus group 900.

[Exposure Apparatus]

Exposure apparatus 100 is an apparatus that transfers a device pattern on a wafer on which a photoresist is coated. Exposure apparatus 100 is equipped with an illumination system that emits an illumination light for exposure, a stage that holds a reticle on which a device pattern and the like are formed that are illuminated by the illumination light, a projection optical system that projects the device pattern and the like illuminated by the illumination light, a stage that holds a wafer that is subject to exposure, their control system, and the like. Exposure apparatus 100 transfers the device pattern on the reticle to a plurality of different areas on the wafer, by driving each of the stages with respect to the illumination light for exposure and alternately repeating synchronous scanning of the reticle and the wafer and stepping of the wafer. That is, exposure apparatus 100 is an exposure apparatus by a scanning exposure (step-and-scan) method.

The control system of the exposure apparatus is equipped with an exposure dose control system that controls the intensity (exposure dose) of the illumination light, and a stage control system that performs synchronous control of both the stages and autofocus/leveling control (hereinafter, simply referred to as "focus control") to conform a wafer surface to within a depth of focus of the projection optical system, and the like.

The exposure dose control system performs feedback control that controls an exposure dose so as to make the exposure dose coincide with a targeted value thereof based on detection values of various types of exposure dose sensors that can detect the exposure dose. The stage control system realizes position control and speed control of both the stages by performing feedback control based on measurement values of an interferometer that measures the positions of the stages. In exposure apparatus 100, a multipoint AF (autofocus) sensor that detects focus/leveling deviation of the wafer surface at a plurality of detection points is arranged. The stage control system realizes the focus control by detecting the wafer surface height at, for example, 9 detection points (9 channels) out of the plurality of detection points of the multipoint AF sensor and performing feedback control so as to make the wafer surface corresponding to an exposure area conform to an image plane of the projection optical system.

Incidentally, in exposure apparatus 100, a two-dimensional coordinate system related to synchronous control of both the stages is made to be an XY coordinate system (having a synchronous scanning direction in a Y-axis direction), a coordinate axis parallel to an optical axis of the projection optical system is made to be a Z-axis, and the stage control is performed with an XYZ coordinate system. In the following description, explanation will be made assuming that out of the stage control systems, a control system that performs the synchronous control of both the stages is a synchronous control system and a control system that controls the Z-position and a rotation amount around an X-axis and a Y-axis of the stage position (wafer surface) is a focus control system.

[Control System Parameter]

In exposure apparatus 100, several factors that define the operations of each of the control systems described above are parameterized to be control system parameters, and values of the control system parameters can freely be set. The control system parameters are mainly divided into adjustment system parameters for which the process is suspended and apparatus adjustment is required and non-adjustment system parameters for which apparatus adjustment is not required.

Several representative examples of the adjustment system parameters will be explained. First of all, with regard to the exposure dose control system, there are an adjustment parameter of an exposure dose sensor that detects an exposure dose, an adjustment parameter of an illuminance measurement sensor that measures the intensity of the illumination light on the wafer surface, and the like. Further, with regard to the synchronous control system, there are a parameter such as a coefficient value of a correction function for correction of bending of a movable mirror used to correct positional error due to the bending of the movable mirror, which is arranged on the stage that holds a wafer or a reticle in order to reflect a laser beam from an interferometer used for position measurement of the stages, position loop gain and speed loop gain of the feedback control, integration time constant, and the like. Further, with regard to the focus control system, there are a focus offset that is an offset adjustment value of focus control when making the wafer surface and an image surface of a projection lens conform on exposure, a leveling adjustment parameter used to make the wafer surface and the image surface of the projection lens conform (be parallel) on exposure, linearity of a position sensitive detector (PSD) that is a sensor at an individual detection point of the multipoint AF sensor, an offset among the sensors, detection repeatability of each sensor, an offset among channels, an irradiation position of an AF beam onto the wafer (i.e. a detection point), and other parameters such as a parameter related to AF surface correction and the like. All the values of these adjustment system parameters need to be adjusted by calibration or test operation of the apparatus.

Next, representative examples of the non-adjustment system parameters will be explained. First of all, with regard to exposure dose control, for example, there are a parameter related to selection of an ND filter in the illumination system, an exposure dose targeted value and the like. Further, with regard to synchronous control system, for example, scanning speed of the stages and the like can be cited. Further, with regard to focus control system, for example, there are a selection state of focus sensors for 9 channels, a parameter related to focus level difference correction map (to be described later), a fine adjustment amount of a focus offset, a scan direction for an edge shot of a wafer outer periphery, and the like. All of the setting values of these parameters can be changed without performing calibration of the apparatus, and most of them are designated by an exposure recipe. Incidentally, the ND filter is selected based on the result of average power check that is performed only once in a state where an exposure dose targeted value is appropriately set (e.g. to the minimum) when starting exposure to a certain wafer. Further, also the scan speed is finely adjusted to some extent depending on the selection of the ND filter.

A linewidth and a transfer position of a device pattern that is formed by transfer on a wafer are deviated from designed values due to each control error of exposure dose, synchronous accuracy, and focus. Therefore, in exposure apparatus 100, time-series data of a control amount related to exposure dose error obtained from the exposure dose control system (exposure dose trace data), time-series data of a control amount related to synchronous accuracy error obtained from the synchronous control system (synchronous accuracy trace data), and time-series data of a control amount related to focus error obtained from the focus control system (focus trace data) are logged, and these data are used in analytical evaluation of the pattern linewidth and/or transfer position.

Incidentally, in exposure apparatus 100, two of the stages each of which holds a wafer are arranged. Wafers to be subsequently processed are alternately loaded on both the sages and sequentially exposed. With such an arrangement, in the middle of performing exposure to a wafer held by one of the stages, another wafer is loaded on the other of the stages and alignment and the like can be performed, and therefore the throughput is improved compared with the case where wafer exchange, alignment and exposure are repeatedly performed on one stage. In FIG. 1, a section that performs scanning exposure to a wafer held by one of the stages is shown as a processing section 1, and a section that performs scanning exposure to another wafer held by the other of the stages is shown as a processing section 2.

On a wafer, there are a plurality of areas on which device patterns are formed by transfer. Since these areas are areas each formed by one-time irradiation of exposure light, they are also called shot areas. With each shot area, wafer marks are arranged. The wafer mark is a mark whose positional information can be detected from its shape and the like. As the wafer mark, for example, a line-and-space mark can be used. As the shape of the wafer mark, besides the line-and-space mark, a box mark, a cross mark and the like can be employed.

In exposure apparatus 100, a device pattern on the reticle needs to be exposed so as to be accurately overlaid with a shot area on the wafer. In order to realize accurate overlay exposure, the position of each shot area needs to accurately be obtained. The wafer marks are arranged for obtaining the position (the position of the center) of each shot area. Since the wafer marks are formed by transfer together with a device pattern with which the wafer marks are arranged, a positional relation between them on the wafer is substantially fixed, and if the positions of the marks are obtained, the center position of the shot area can be obtained.

In order to measure the positions of the wafer marks, an alignment system for measuring the positions of the wafer marks is arranged in exposure apparatus 100. This alignment system, for example, photoelectrically detects a waveform related to the wafer surface including the wafer marks, for example, a waveform corresponding to unevenness of the wafer surface, using an alignment sensor equipped inside. With this photoelectrical detection, waveform data corresponding to the wafer surface including the wafer marks can be obtained. The alignment system extracts a waveform corresponding to the mark (a mark waveform) from the detected waveform data, and based on the extraction result, detects the position of the mark waveform within a detection field of the alignment sensor. Based on the detected position of the mark waveform and the position of the detection field of the alignment sensor, the alignment system computes the positions of the wafer marks in the XY coordinate system. In exposure apparatus 100, a transfer position of the device pattern is determined based on the computation result.

Incidentally, in order to perform accurate overlay exposure of the device patterns, positional information of all the shot areas on the wafer may be measured, but such a method could affect the throughput. Thus, in exposure apparatus 100, a global alignment technology is employed, in which the wafer marks to actually be measured are limited and from the measurement result of the measured positions of the wafer marks, the arrangement of the shot areas on the wafer is statistically estimated. In exposure apparatus 100, wafer alignment by a so-called EGA method is employed as the global alignment, in which the deviation of an actual shot arrangement with respect to the designed shot arrangement is expressed in the polynomial of X and Y and the proper coefficients in the polynomial are obtained by performing a statistical computation. In the wafer alignment by the EGA method, first of all, several shot areas subject to measurement whose wafer marks are measured are selected. The selected shot areas are called sample shots. The alignment system measures the positions of the wafer marks arranged at the samples shots (samples marks). Hereinafter, such a measurement operation will be referred to as an EGA measurement.

In the EGA measurement, the judgment is made of whether or not the waveform data is appropriate as data used to extract the mark waveform. Specifically, how accurately the mark waveform can be detected from the waveform data is obtained from the shape of the waveform data, and the degree of accuracy is quantified and computed as a detection result score. In the case where this detection result score is better than a predetermined threshold value, it is assumed that the marks could be detected and the mark detection result of the sample marks is regarded as OK, whereas in the case where the detection result score is less than or equal to the predetermined threshold value, it is assumed that the mark detection could not be performed and the mark detection result of the sample marks is regarded as NG.

In the wafer alignment by the EGA method, a correction amount of the XY position coordinate of each shot area is estimated from the result of the EGA measurement, that is, the statistical computation based on positional information of several sample marks. Hereinafter, such a computation will be referred to as an EGA computation. Incidentally, the wafer alignment by the EGA method is disclosed in detail in, for example, Kokai (Japanese Unexamined Patent Application Publication) No. 61-044429 and the corresponding U.S. Pat. No. 4,780,617 and the like, and as long as the national laws in designated states or elected states, to which this international application is applied, permit, the disclosure of the publication and U.S. Patent cited above are fully incorporated herein by reference.

An XY correction amount of the position of each shot area that is obtained by this polynomial is called an EGA correction amount. The coefficients of the polynomial obtained in the wafer alignment by the EGA method are obtained using the least-squares method, and therefore a deviation (an error of a nonlinear component) remains between the actual measurement value of the mark position and the mark position corrected by the EGA correction amount. Such a deviation is called a residual error. It is a matter of course that the residual error is preferably small from the viewpoint of overlay accuracy.

One of means for reducing the residual error is to make an EGA polynomial model be a high-order expression. The residual error can naturally be reduced by, for example, making the EGA polynomial model not be a primary expression, but be a quadratic expression or a cubic expression. In the case of making the EGA polynomial model a high-order expression, however, the number of sample shots needs to be increased accordingly.

Further, in the case where measurement results of some of sample marks are remarkably deviated from the actual shot arrangement, the entire residual error tends to be larger. Accordingly, it is desirable to reject the measurement positions of such sample marks so that they are not used in the EGA computation. That is, it is also possible to increase the position estimation accuracy by not using some of the positions of the sample marks, which have been measured by the EGA measurement, in the EGA computation. As is described above, the selection of the number and/or the placement of sample marks is/are (an) important factor(s) for the wafer alignment by the EGA method.

[Alignment-Related Parameter]

In exposure apparatus 100, several factors that set operations related to the wafer alignment by the EGA method by the alignment system described above are parameterized, and the setting values thereof can be set as alignment-related parameters. The alignment-related parameters are divided mainly into waveform processing parameters for which re-measurement by the alignment system is not required to adjust their values, and actual-measurement-required parameters for which the re-measurement is required.

As the waveform processing parameters, for example, a combination of sample marks (the number and/or the positions of the sample marks) actually used in the EGA computation, which is selected from the already measured sample marks, can be cited. That is, in the case where all of the measured sample marks are not used in the EGA computation, but the EGA computation using the appropriate combination of the measured sample marks is performed, such a combination serves as a waveform processing parameter. Further, designation of reject of the sample marks by the mark or the shot area as a unit, a reject limit value (a threshold value serving as a reference as to whether a sample mark is rejected from the EGA computation or not) on mark detection, and the like are included in the waveform processing parameters.

Further, in the case where the alignment system is equipped with a plural types of alignment sensors, and all the sensors perform mark detection, the types of the alignment sensors (such as an FIA (Field Image Alignment) method or an LSA (Laser Step Alignment) method) that detect waveform data used in the actual detection of mark positions also included in the waveform processing parameters. Further, a processing condition with respect to waveform data, that is, a signal processing condition (such as a signal processing algorithm (an edge extraction method, a template matching method, a folding-back autocorrelation method or the like, a slice level or the like) are also included in the waveform processing parameters.

Further, the waveform processing parameters also include the type of the EGA polynomial model (a 6-parameter model, a 10-parameter model, an intra-shot averaged model, a shot factor indirectly-applied model, a high-order EGA processing condition (a use order and a use correction coefficient), and the like), a weighting EGA processing condition, an extension EGA processing condition of an EGA optional function (an intra-shot multipoint EGA implementation condition, an EGA calculation model, a shot component correction condition, and the like), a correction amount to be added to the measurement position of the measured mark (such as an alignment correction value) and the like.

Further, the actual-measurement-required parameters include the types of sample marks (including the case where the mark shape is different), the number and/or the placement (in the case where new sample points are measured), an illumination condition (such as an illumination wavelength, a contrast field, illumination intensity, and absence/presence of phase difference illumination) when illuminating a mark on mark measurement, a focus state (such as a focus offset) on mark detection, designation of an alignment sensor when changing an alignment sensor used for mark detection, and the like.

The control system parameters and the alignment-related parameters are not limited to those described above. Further, although all the control system parameters and the alignment-related parameters are basically variable, all the alignment-related parameters are not made variable but some of the alignment-related parameters may be made invariable (fixed). In such a case, which alignment-related parameters should be fixed can be selected by a user as needed.

As is described above, in exposure apparatus 100, the control system parameters and the alignment-related parameters can be set as the apparatus parameters. The setting values of these parameters need to be adjusted beforehand to some extent so that device patterns on a reticle can be favorably transferred on a wafer.

[Track]

Within track 200, a composite measurement/inspection instrument 120 that can perform various measurement/inspection of a wafer before and after (i.e. anterior and posterior) exposure of wafers in exposure apparatus 100, and a coater/developer (hereinafter, shortly referred to as a C/D) 110 are arranged.

[Coater/Developer]

C/D 110 coats a photoresist (a photosensitive agent) to a wafer, and also develops the wafer after exposure. C/D 110 can operate independently from exposure apparatus 100 and measurement/inspection instrument 120. C/D 110 is placed along transport line of track 200. Accordingly, with this transport line, transportation of wafers can be performed among exposure apparatus 100, C/D 110 and measurement/inspection instrument 120.

[Measurement/Inspection Instrument]

Measurement/inspection instrument 120 is equipped with an anterior measurement/inspection instrument that performs measurement before exposure and a posterior measurement/inspection instrument that performs measurement after exposure.

The anterior measurement/inspection instrument performs measurement for optimizing exposure conditions in exposure apparatus 100 before a wafer is transported to exposure apparatus 100. One of measurement subjects of the anterior measurement/inspection instrument is a surface state of the wafer that serves as the exposure subject. The anterior measurement/inspection instrument measures so-called shot flatness (which is also called device topography or focus level difference) that is respective surface shape (unevenness) of the wafer surface that has occurred due to device patterns and the like formed on the respective areas of a preceding layer of the wafer. If the shot flatness is known before exposure, the control accuracy is improved by reflecting the information on the shot flatness in focus control. In the anterior measurement/inspection instrument, for example, a multipoint AF sensor that is matched with the multipoint AF sensor in exposure apparatus is arranged, and the multipoint AF sensor of the anterior measurement/inspection instrument detects the wafer surface and measures the shot flatness. Measurement/inspection instrument 120 can operate independently from exposure apparatus 100 and C/D 110. Further, measurement/inspection instrument 120 can output the measurement result of the shot flatness in the anterior measurement/inspection instrument as data to the outside via a communication network within the system.

Besides, the anterior measurement/inspection instrument can perform measurement (EGA measurement) of wafer marks formed on the wafer, before the wafer is transported into exposure apparatus 100. If whether or not the wafer marks are appropriate as sample marks can be judged by this anterior measurement, then the EGA measurement of exposure apparatus 100 can be efficient measurement. Measurement/inspection instrument 120 has a position measurement function of wafer marks on the wafer that is equivalent to the alignment system of exposure apparatus 100. That is, measurement/inspection instrument 120 has an alignment system that is matched with the alignment system of exposure apparatus 100. In the alignment system of measurement/inspection instrument 120, alignment-related parameters can be set similarly to the alignment system of exposure apparatus 100, and the sample marks can be measured in the same state as the alignment system of exposure apparatus 100. In the anterior measurement/inspection instrument, the EGA computation can also be performed based on the result of this EGA measurement. That is, an alignment unit library having the same contents as those of an alignment unit is mounted in measurement/inspection instrument 120. A plurality of the alignment unit libraries, which correspond to the model and a soft version of an exposure apparatus that is subject to optimization, are mounted and the configuration in which the plurality of alignment unit libraries can be selectively switched is employed.

The posterior measurement/inspection instrument of measurement/inspection instrument 120 performs measurement of linewidth and overlay error of a resist pattern or the like on the wafer after exposure (posterior) which has been transferred in exposure apparatus 100 and developed in C/D 110. Further, measurement/inspection instrument 120 performs defect/foreign substance inspection, probing processing, repair processing of device patterns of the respective layers on the wafer, and the like. Incidentally, also in C/D 110 and measurement/inspection instrument 120, processing sections 1 and 2 are arranged and reduction in the processing time is realized.

Meanwhile, exposure apparatus 100, C/D 110, and measurement/inspection instrument 120 are inline connected to one another. The inline connection in this case means the connection between the apparatuses and between processing units within each apparatus via a transport device that automatically transports a wafer such as a robot arm and/or a slider. With the inline connection, the time for delivery of the wafer between exposure apparatus 100 and C/D 110 can be remarkably shortened.

Exposure apparatus 100, C/D 110, and measurement/inspection instrument 120 that are inline connected can also be regarded as one substrate processing apparatus (100, 110, 120) as integral. The substrate processing apparatus (100, 200, 120) performs a coating process of coating a photosensitive agent such as a photoresist to a wafer, an exposure process of transferring patterns of a mask or a reticle on the wafer which is coated with the photosensitive agent, a development process of developing the wafer to which the exposure process has been completed, and the like.

That is, in device manufacturing system 1000, a plurality of exposure apparatuses 100, C/Ds 110, and measurement/inspection instruments 120 are arranged. Each substrate processing apparatus (100, 110, 120) and device manufacturing processing apparatus group 900 are installed in a clean room where the temperature and the humidity are controlled. Further, data communication can be performed between the respective apparatuses via a predetermined communication network (e.g. LAN: Local Area Network). This communication network is a network that is a so-called intranet arranged with respect to the plants, offices or business establishments of a client.

In the substrate processing apparatus (100, 110, 120), a plurality of wafers (e.g. 20, 25 or 50 wafers) are processed as one unit (which is called a lot). In device manufacturing system 1000, the wafers in a lot as a basic unit are processed and commercialized.

Incidentally, although in device manufacturing system 1000, measurement/inspection instrument 120 is placed within track 200 and inline connected to exposure apparatus 100 and C/D 110, a configuration may also be employed in which measurement/inspection instrument 120 is placed outside track 200 and inline connected adjacently, or measurement/inspection instrument 120 is set offline with exposure apparatus 100 and C/D 110.

[Analytical Apparatus]

Analytical apparatus 500 is an apparatus that operates independently from exposure apparatus 100 and track 200. Analytical apparatus 500 collects various types of data from various apparatuses (e.g. processing contents of the apparatuses), analyzes data related to a series of processes to a wafer. As hardware that realizes such analytical apparatus 500, for example, a personal computer (hereinafter, shortly referred to as a "PC" as needed) can be employed. In this case, the analytical processing is realized by executing an analytical program that is executed by a CPU (not shown) of analytical apparatus 500. This analytical program is recorded in a medium (information recording medium) such as a CD-ROM, and is executed in a state of being installed in the PC from the medium. Analytical apparatus 500 is equipped with an alignment simulator and a linewidth simulator.

The alignment simulator acquires reference EGA data from exposure apparatus 100 as the result (reference computation result) of the EGA computation that has been implemented under predetermined reference alignment conditions (reference alignment parameters) that are set by default. Here, the reference alignment conditions (reference alignment parameters) are conditions (parameters) (including a waveform processing parameter and an actual measurement parameter which will be described later) in which specifying sample shots that are subject to measurement, an illumination condition at the time of measuring marks of the sample shots, a waveform processing algorithm with respect to an obtained mark signal, an EGA computation model and the like are set by default in advance as predetermined conditions, and are alignment conditions that have actually been applied to exposure apparatus 100. The alignment simulator acquires comparison EGA data from exposure apparatus 100 as the result (comparison computation result) of the EGA computation that has been implemented changing some or all of the reference alignment conditions. The alignment simulator acquires the measurement result of overlay error of device patterns that have been actually measured by the posterior measurement/inspection instrument, and estimates optimal alignment conditions based on the reference EGA data, the measurement result of overlay error corresponding to the reference EGA data, the comparison EGA data and the like.

The linewidth simulator can compute a simulation value of linewidth of a device pattern, based on statistical values of respective control errors of exposure dose, synchronous accuracy and focus that are computed from the trace data of exposure dose, synchronous accuracy and focus acquired in exposure apparatus 100.

[Device Manufacturing Processing Apparatus Group]

As device manufacturing processing apparatus group 900, a CVD (Chemical Vapor Deposition) apparatus 910, an etching apparatus 920, a CMP (Chemical Mechanical Polishing) apparatus 930, and oxidation/ion-implantation apparatus 940 are arranged. CVD apparatus 910 is an apparatus that forms a thin film on a wafer, and CMP apparatus 930 is a polisher that planarizes the surface of a wafer by chemical mechanical polishing. Further, etching apparatus 920 is an apparatus that performs etching to a developed wafer, and oxidation/ion-implantation apparatus 940 is an apparatus for forming an oxide film on the surface of the wafer or implanting impurities in a predetermined position on the wafer. Also in CVD apparatus 910, etching apparatus 920, CMP apparatus 930 and oxidation/ion-implantation apparatus 940, two processing sections (processing sections 1 and 2) are arranged to improve the throughput. Further, also in CVD apparatus 910, etching apparatus 920, CMP apparatus 930 and oxidation/ion-implantation apparatus 940, the transportation routes in which a wafer can be transported among these apparatuses are arranged, similarly to exposure apparatus 100 and the like. Besides the apparatuses described above, device manufacturing processing apparatus group 900 also includes apparatuses that perform dicing processing, packaging processing, bonding processing and the like.

[Device Manufacturing Process]

Figure 2:
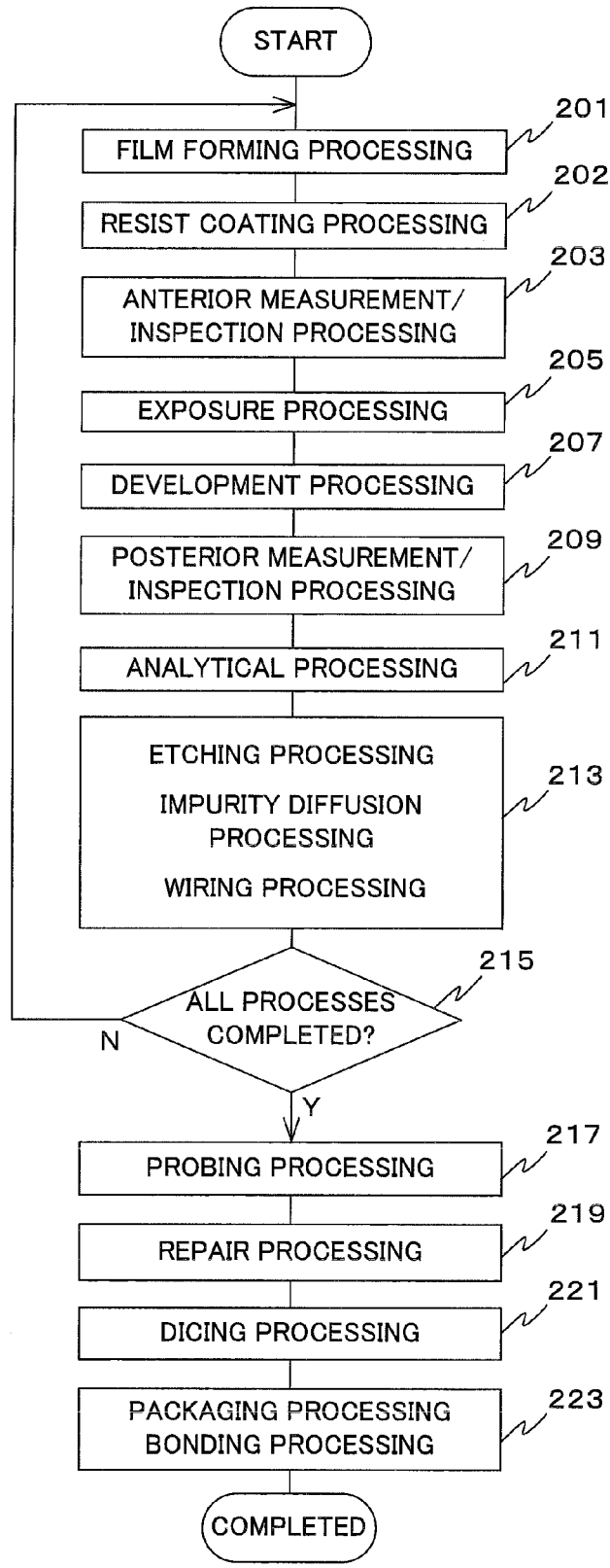
FIG. 2 is a flowchart showing a device manufacturing process in the device manufacturing system.
Figure 3:
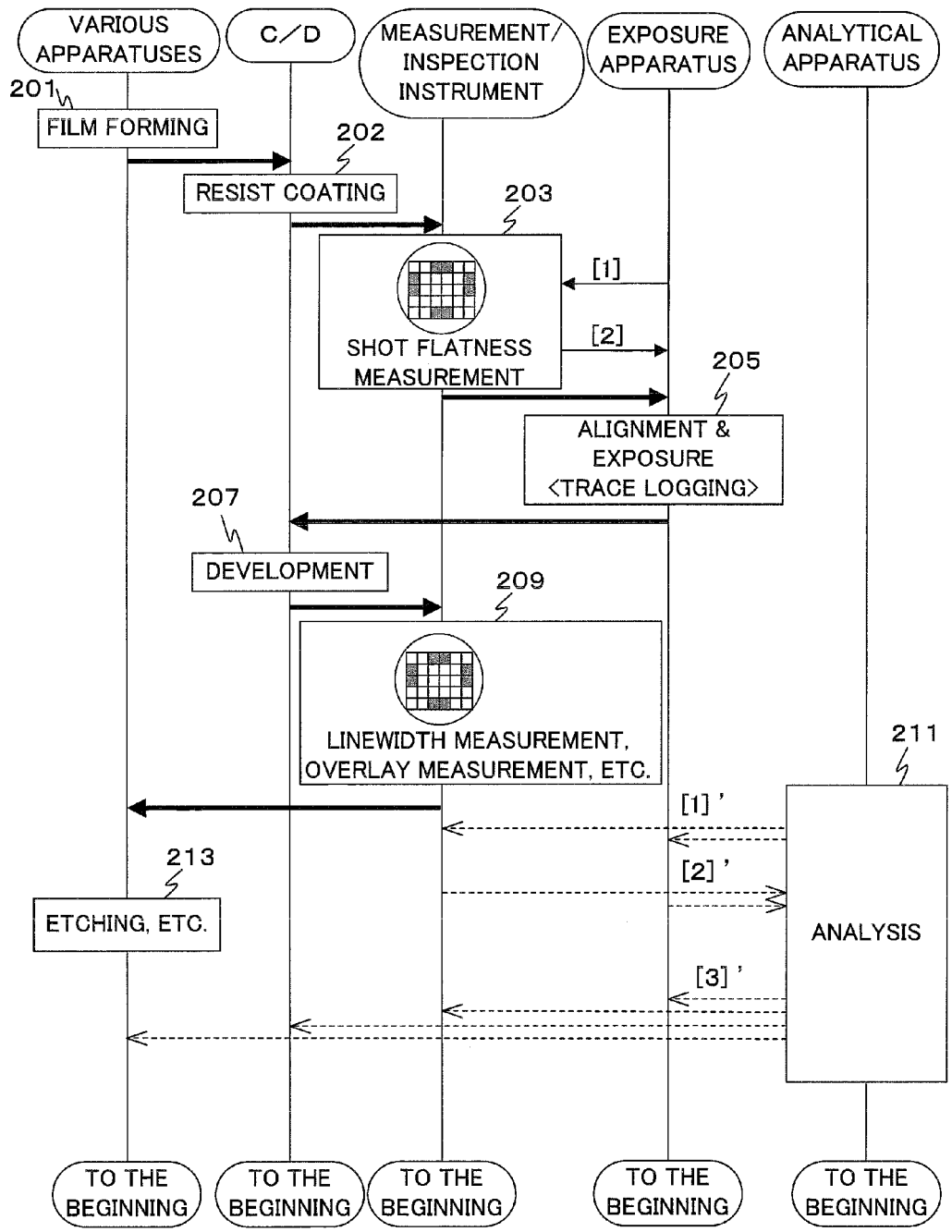
FIG. 3 is a view showing a flow of a wafer and a flow of data in the device manufacturing process.

Next, an example of a device manufacturing process performed under control of host 600 will be explained. FIG. 2 shows a flowchart of the device manufacturing process, and FIG. 3 shows a flow of a wafer and a flow of data related to a repeated process in the device manufacturing process. The device manufacturing process in device manufacturing system 1000 is scheduled and managed by host 600 and management controller 160. Each of FIGS. 2 and 3 shows a series of processes with respect to one wafer, but in actuality, the processing shown in FIGS. 2 and 3 is repeated to respective wafers in a unit of lot.

As shown in FIGS. 2 and 3, first of all, a film is formed on a wafer in CVD apparatus 910 (step 201), and the wafer is transported to C/D 110, in which a resist is coated on the wafer (step 202). Next, the wafer is transported to measurement/inspection instrument 120, in which anterior measurement is performed (step 203). In the anterior measurement, for example, shot flatness (focus level difference of shot areas) is measured of shot areas selected as measurement subject (hereinafter, referred to as measurement shots) from a plurality of shot areas of the preceding layer that have been already formed on the wafer. Although the number and the placement of the measurement shots can be arbitrarily selected, 8 shots on the periphery of the wafer can be selected as shown in FIG. 3, for example. Besides, in the anterior measurement, optimization of wafer alignment such as selection of sample marks is performed by performing the EGA measurement and the EGA computation, and inspection of foreign substance, defect or the like on the wafer and the like are performed.

The measurement result of measurement/inspection instrument 120 is sent to exposure apparatus 100. This measurement result is used in focus control, wafer alignment and the like on scanning exposure in exposure apparatus 100.

Incidentally, in the case where optimization of wafer alignment or the like such as anterior EGA measurement and EGA computation is performed, exposure apparatus 100 forwards data necessary for the EGA measurement and EGA computation of the alignment-related parameter and the like ([1] in FIG. 3) to measurement/inspection instrument 120. Measurement/inspection instrument 120 transmits information on the optimal value of the alignment-related parameter and the like based on the measurement/inspection result to exposure apparatus 100 ([2] in FIG. 3). Exposure apparatus 100 sets the optimal value of the alignment-related parameter.

Subsequently, after transporting the wafer to exposure apparatus 100, loading the wafer on the stage within exposure apparatus 100, and performing wafer alignment, a circuit pattern on the reticle is transferred onto the wafer in exposure apparatus 100 (step 205). On this operation, exposure apparatus 100 monitors the above-described trace data of exposure dose, synchronous accuracy and focus during exposure of measurement shots, and stores the data in an internal memory. Next, the wafer is transported to C/D 110, in which development is performed (step 207).

After that, the wafer is transported to measurement/inspection instrument 120. Then, posterior measurement/inspection with respect to the wafer is performed in measurement/inspection instrument 120 (step 209). In this case, for example, a linewidth and overlay error of the resist image formed on the wafer are measured, and a foreign substance and defect on the pattern are inspected.

Analytical apparatus 500 performs analysis related to the linewidth or the overlay based on information from exposure apparatus 100 or measurement/inspection instrument 120 (step 211). As shown in FIG. 3, in the middle of the analysis, analytical apparatus 500 issues a forwarding request ([1]') for various types of data (control trace data, control system parameter, alignment-related parameter and alignment result) to measurement/inspection instrument 120 and/or exposure apparatus 100 when needed. (In response to the request, exposure apparatus 100 and/or measurement/inspection instrument 120 send(s) the various types of data to analytical apparatus 500 ([2]'). Analytical apparatus 500 issues analytical information to each apparatus in accordance with the analytical result ([3]'). Incidentally, the details of the analytical processing in analytical apparatus 500 and a flow of data will be described later on. Further, after analytical apparatus 500 acquires the various types of data, exposure apparatus 100 may immediately delete the trace data or the like stored inside.

Meanwhile, the wafer is transported from measurement/inspection instrument 120 to etching apparatus 920, and etching is performed in etching apparatus 920, impurity diffusion processing and wiring processing (such as aluminum, or copper), and film forming in CVD apparatus 910, planarization in CMP apparatus 930, ion implantation in oxidation/ion-implantation apparatus 940, and the like are performed when needed (step 213). Then, the judgment is made in host 600 as to whether or not all the processes have been completed and all the patterns have been formed on the wafer (step 215). When the judgment is denied, the procedure returns to step 201, and when the judgment is affirmed, the procedure proceeds to step 217. In this manner, by repeatedly executing the series of processes of film forming/resist coating to etching and the like according to the number of processes (layers), device patterns are layered on the wafer to form a semiconductor device.

After completing the repeated process, probing processing (step 217) and repair processing (step 219) are executed in device manufacturing processing apparatus group 900. In the case where memory defect is detected in step 219, for example, processing for substituting a redundant circuit is performed. Analytical apparatus 500 can also send information of the place where abnormality of the detected linewidth or overlay occurs and the like to an apparatus that performs the probing processing and the repair processing. In an inspection device (not shown), the place where overlay abnormality occurs on the wafer can be excluded by the chip as a unit from the subject to probing processing and repair processing. Afterward, dicing processing (step 221), packaging processing and bonding processing (step 223) are executed, and a product chip is finally completed. Incidentally, the posterior measurement/inspection process in step 209 may be performed after the etching in step 213. In this case, measurement of linewidth and/or overlay error will be performed to images formed after the etching of the wafer.

[Processing of Analytical Apparatus]

Next, the analytical processing by analytical apparatus 500 in step 211 will be explained in detail. In the analytical processing, the measurement result of measurement/inspection instrument 120 with respect to the processes performed so far is analyzed, and a targeted transfer position $X_{target}$ of a shot area in a process to be performed next time (a next process) is determined. In this case, an evaluation function $\Phi$ expressed in the following formula is set, and targeted transfer position $X_{target}$ with which a value of evaluation function $\Phi$ is closest to zero is computed.

$$\Phi = \sum_{i=1}^{m} [v_i \times \{(X_{mean})_i - (X_{target})\}] - \rho$$
$$\Phi = \sum_{i=1}^{m} [v_i \times \{(X_{mean})_i - (X_{target})\}] + \rho \quad (1)$$

In this case, "i" denotes the number of each layer of a wafer. "$v_i$" denotes the weight of the $i^{th}$ layer and a real number not less than zero can be set. This weight is a weight that denotes the importance of overlay requirement accuracy given by electrical link of the layer or the like with respect to a next process that is a target. In this case, for example, for a layer isolated with respect to the target, the setting of $v_i=0$ is also possible.

"m" denotes the number of process that is subject to optimization. Here, "m" usually denotes the number of a layer just before the target layer, but in the case of a subsequent layer including the target layer, targeted transfer position $X_{target}$ can also be computed by predicting the overlay of the present process and subsequent processes of the wafer using the measurement result of other wafers of the same products. "$(X_{mean})_i$" denotes an actually measured transfer position of the $i^{th}$ layer measured by measurement/inspection instrument 120. That is, the above formula (1) includes a term of product sum of values from $1^{st}$ to $m^{th}$ layers given by multiplying the difference between targeted transfer position $X_{target}$ in the next process and actually measured transfer position $(X_{mean})_i$ of the $i^{th}$ layer by weight $v_i$ of the $i^{th}$ layer.

Further, although two evaluation functions $\Phi$ (the formula of the product sum term+$\rho$ and the formula of the product sum term−$\rho$) are defined in the above-formula (1), the formula used as evaluation function $\Phi$ will be selected, depending on whether the value of the product sum is positive or negative in the formula (1) in the embodiment. In general, when the value of the product sum is positive, the upper formula will be selected, and when the value of the product sum is negative, the lower formula will be selected. As will be described later, since the value of $\rho$ is a real value not less than zero, $\rho$ acts so as to make the value of evaluation function $\Phi$ closer to zero.

$\rho$ is a function denoting linewidth management, and its value is computed using the following formula.

$$\rho = u \times \{(W_{target}) - (W_{design})\}/2 \quad (2)$$

Here, "u" is a weight that denotes an overlay permissible degree given in accordance with linewidth variation in the present process. In the case where the overlay permissible degree in accordance with linewidth deviation is not taken into consideration in the formula (1), u=0 is set, which results in $\rho=0$. "$W_{target}$" is a targeted linewidth value in a target layer, and "$W_{design}$" is a designed linewidth value in the target layer. That is, the above formula (2) denotes a value showing linewidth deviation in the target layer given by multiplying the difference between targeted linewidth value $W_{target}$ and designed linewidth value $W_{design}$ by ½, taking into consideration the right-hand side and the left-hand side with the linewidth center as a reference.

However, in the case where, $\{(W_{target})-(W_{design})\}<0$, that is, the linewidth in the target layer becomes thinner, usually $\rho$ is made to be zero ($\rho=0$). Accordingly, the value of $\rho$ is always greater than or equal to zero. In the case of making the linewidth thinner than the designed value in the target layer, the overlay accuracy needs to be set more strictly, and therefore $\rho$ is made to be zero ($\rho=0$) and the overlay permissible degree in accordance with linewidth variation is made to be zero. Meanwhile, in the case of making linewidth $W_{target}$ in the target layer thicker than its designed value $W_{design}$, a permissible range of overlay error can be set wider according to the linewidth, and therefore a positive value in accordance with linewidth variation is set as $\rho$. In some cases, by making linewidth $W_{target}$ in the target layer thinner than its designed value $W_{design}$ according to the overlay requirement of the target layer, the permissible range of overlay error is widened.

In summary, this $\rho$ is an adjustment value of a permissible value of overlay error based on the linewidth in the target layer. Introduction of this $\rho$ allows the linewidth in the target layer to be also taken into consideration when overlay abnormality is detected. Incidentally, in the embodiment, the targeted linewidth also has the upper limit and the lower limit, and the targeted linewidth needs to be secured so as not to exceed the upper limit and the lower limit in the analytical processing.

Incidentally, evaluation function $\Phi$ may also be set individually in the X-axis direction and the Y-axis direction. That is, the weight of the same layer may be set individually with respect to the X-axis direction and the Y-axis direction, and $Y_{target}$ may be computed similarly to the case of $X_{target}$.

Figure 4:
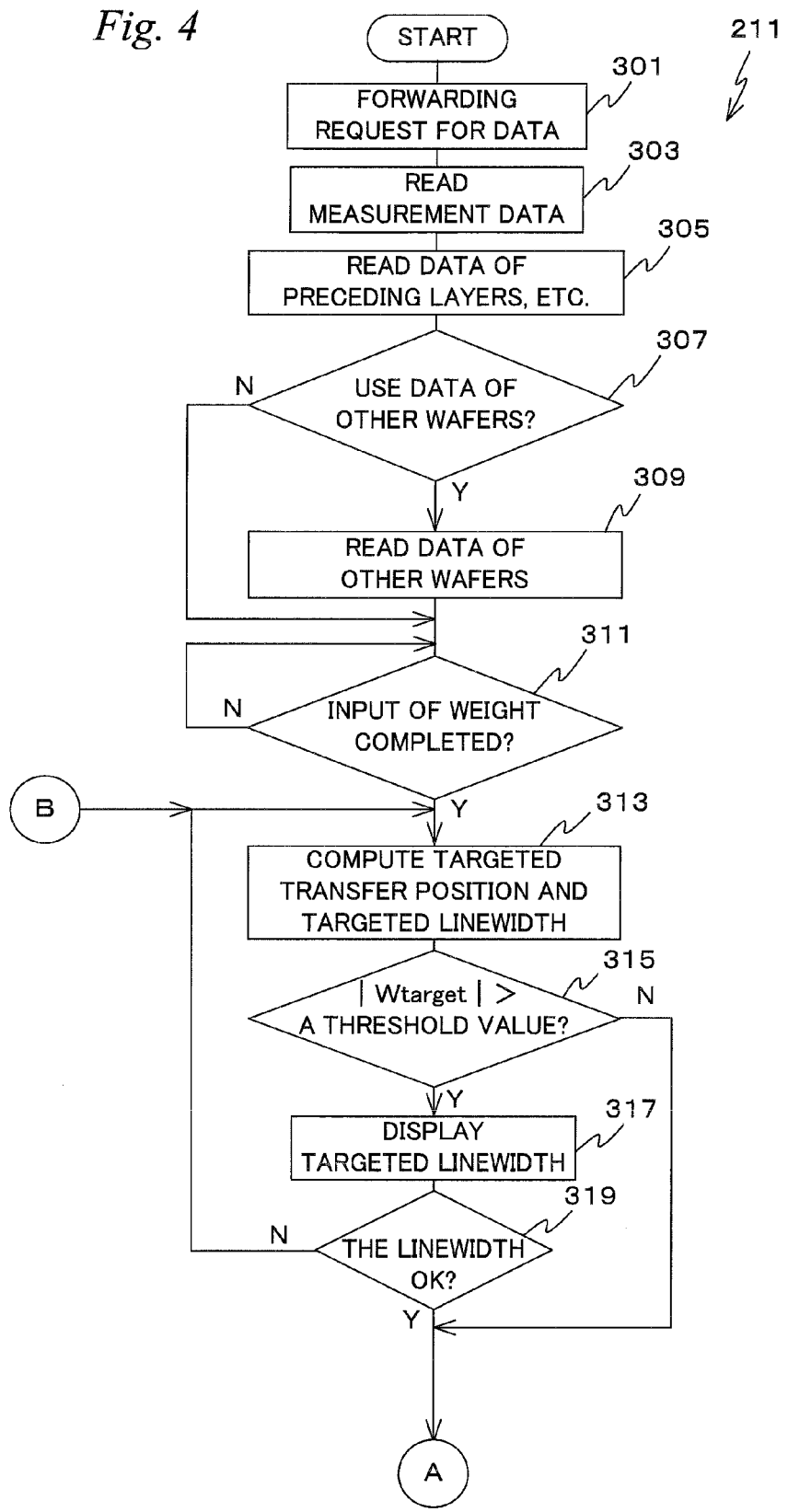
FIG. 4 is a flowchart showing analytical processing (No. 1)
Figure 5:
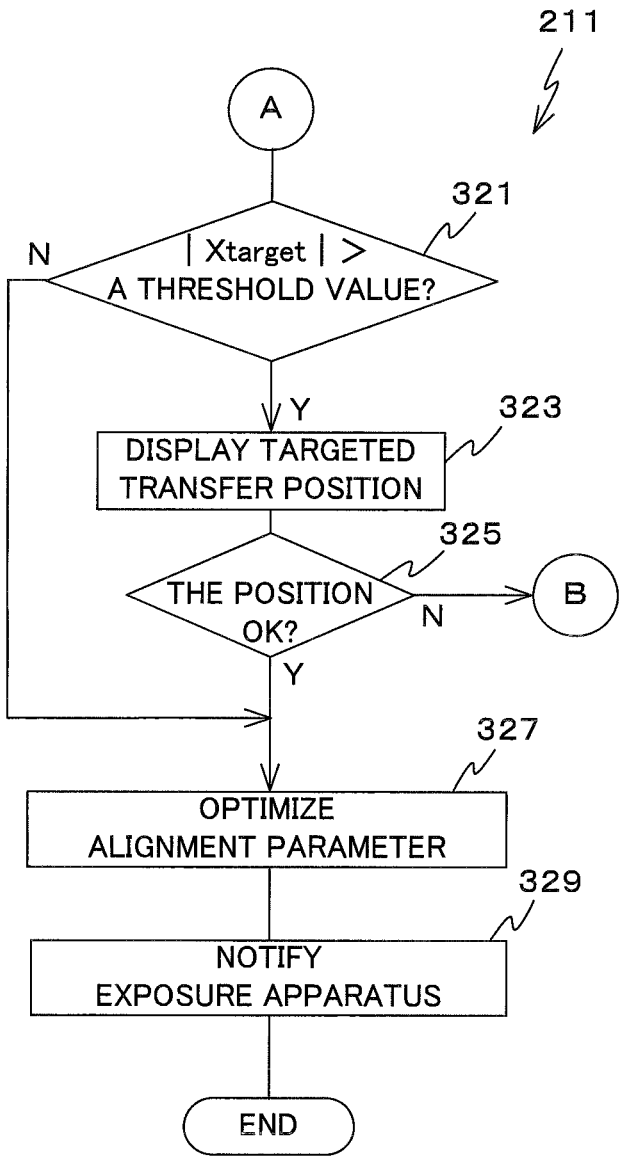
FIG. 5 is a flowchart showing analytical processing (No. 2)

FIGS. 4 and 5 show a flowchart of this analytical processing. As shown in FIG. 4, first of all, in step 301, a forwarding request for measurement data is issued to measurement/inspection instrument 120. In the next step, step 303, measurement data regarding overlay error at each sample point of measurement shots in the present process (a process in which a resist pattern has been formed) (i.e. the actual measurement value of overly error of the measurement shots in the present process), which has been sent from measurement/inspection instrument 120, is read. In the next step, step 305, data regarding overlay or linewidth of the layers before the layer of the present process of the wafer is read from a storage device (not shown). In this case, as the data to be read, there are the actual measured transfer positions (i.e. $(X_{mean})_i$) of measurement shot areas of each layer up to the preceding layer, and the like.

In the next step, step 307, whether to use data of other wafers or not is judged. Such judgment is made based on information set in advance. Here, in the case where only the data related to the current wafer is used in computation of targeted transfer position $X_{target}$, the judgment is denied, whereas in the case where data related to other wafers (data empirically obtained so far in the same process) is also used in computation of targeted transfer position $X_{target}$, the judgment is affirmed. If the judgment in step 307 is affirmed, the procedure proceeds to step 309, and if the judgment is denied, the procedure proceeds to step 311. In step 309, data related to overlay in other wafers is read from the storage device (not shown). Incidentally, at this point in time, the product sum number "m" of the product sum term in evaluation function $\Phi$ is determined.

In the next step, step 311, whether weight $v_i$ of each layer has been set or not is judged. At this point in time, a setting screen for setting the weight of each layer is displayed on a screen of analytical apparatus 500. An operator operates a mouse or a keyboard while referring the screen, and sets weight $v_i$ of each layer. Weight $v_i$ of each layer is determined taking into consideration the electrical link with a target layer (a layer to be exposed next time), as is described previously. In this case, in addition to this $v_i$, "u" in the formula (2) is also set together.

Incidentally, weight $v_i$ may also be set automatically. That is, the weight is calculated in advance using the electrical link between a target layer and each layer and stored in the storage device (not shown), and such weight may be used in calculation. In this case, the setting screen of the weight does not have to be displayed on the screen of analytical apparatus 500, and step 311 does not have to be performed.

When the judgment in step 311 is affirmed, the procedure proceeds to the next step, step 313. In step 313, targeted transfer position $X_{target}$ of the target layer with which the value of evaluation function $\Phi$ is closest to zero and targeted linewidth $W_{target}$ are computed, for example, using the least-squares method. In this case, how to set $\rho$ differs depending on the value of the product sum term in the formula (1), as is described previously.

In the next step, step 315, an absolute value of computed targeted linewidth $W_{target}$ and a threshold value are compared. This threshold value is a predetermined threshold value of linewidth set in advance. This threshold value is determined based on the upper and the lower limit values of linewidth that are permissible in the target layer. In this case, whether or not $|W_{target}|$ is exceeds the threshold value is judged. When the judgment is affirmed, the procedure proceeds to step 317, and when the judgment is denied, the procedure proceeds to step 321 in FIG. 5. That is, in step 317, targeted linewidth $W_{target}$ and the threshold value are displayed. Such display may be a graphical display or simply a numerical display. In this display, a button for confirming this targeted linewidth is right (OK) or wrong (NG) is also displayed.

The operator designates OK or NG by operating a pointing device. In step 319, whether or not this designation is OK (the linewidth is OK) is judged. When this judgment is affirmed, the procedure proceeds to step 321 in FIG. 5, and when the judgment is denied, the procedure returns to step 313. That is, if targeted linewidth $W_{target}$ computed in step 313 described above falls outside the permissible range, the procedure returns to step 313 and targeted transfer position $X_{target}$ and targeted linewidth $W_{target}$ are re-calculated. In other words, steps 313→315→317→319 are repeated until target linewidth $W_{target}$ becomes smaller than or equal to the threshold value or OK is designated by the operator. Incidentally, if the judgment in step 319 is NG at least once, the value of $\rho$ may also be set forcibly to zero. With this setting, the computation subject in step 313 becomes only the targeted transfer position, and therefore the processing in steps 315 to 319 can be omitted. Further, if $|W_{target}|$ exceeds the threshold value in step 313, a linewidth whose absolute value is the threshold value may be set as $W_{target}$ (the reference signs follow the original data).

In step 321 in FIG. 5, an absolute value of computed targeted transfer position $X_{target}$ and the threshold value are compared. This threshold value is a predetermined threshold value of overlay error set in advance. In this case, whether or not $|X_{target}|$ exceeds the threshold value is judged. When the judgment is affirmed, the procedure proceeds to step 323, and when the judgment is denied, the procedure proceeds to step 327. In step 323, targeted transfer position $X_{target}$ and the threshold value are displayed. This display may be a graphical display or simply a numerical display. In this display, a button for confirming this targeted transfer position $X_{target}$ is right (OK) or wrong (NG) is also displayed. The operator designates OK or NG by operating a pointing device.

In the next step, step 325, whether or not the designation by the operator is OK is judged. When this judgment is affirmed, the procedure proceeds to step 327, and when the judgment is denied, the procedure returns to step 313 in FIG. 4. That is, if targeted transfer position $X_{target}$ computed in step 313 described above falls outside the permissible range, the procedure returns to step 313 and targeted transfer position $X_{target}$ is re-calculated. In other words, steps 313→315→317→319→321→323→325 are repeated until targeted transfer position $X_{target}$ becomes smaller than or equal to the threshold value or OK is designated by the operator.

Further, the threshold value of targeted linewidth $W_{target}$ in step 315 and the threshold value of targeted transfer position $X_{target}$ in step 321 may be set beforehand as a boundary condition in step 313. In this case, because both the targeted linewidth and targeted transfer position not more than the threshold values are computed, steps 315 to 319 and steps 321 to 325 do not have to be performed.

In step 327, based on computed targeted transfer position $X_{target}$ and targeted linewidth $W_{target}$, the alignment-related parameter is optimized using the alignment simulator so that a transfer position in a target layer is deviated only by $X_{target}$, and the control system parameter is optimized using the linewidth simulator so that a linewidth of a pattern to be transferred becomes targeted linewidth $W_{target}$. The optimization of the parameters by the alignment simulator and the linewidth simulator is performed based on the log data in exposure apparatus 100 and the measurement/inspection result in measurement/inspection instrument 120. For example, $X_{target}$ can be added as an offset amount of the alignment-related parameter, or a table that shows a relation between control error of exposure dose, synchronous accuracy and focus, and the linewidth is created in advance, and based on the control error of exposure dose, synchronous accuracy and focus corresponding to the targeted linewidth in the table, the control system parameter that actually occurs during exposure can be obtained as the optimal parameter. The alignment-related parameter and the control system parameter can be optimized for each shot. The present invention is not, however, limited to this optimization method. Incidentally, in the case where targeted linewidth $W_{target}$ is not computed, the control system parameter does not have to be optimized.

In the next step, step 329, data related to the optimized alignment-related parameter and control system parameter is notified to exposure apparatus 100 and/or measurement/inspection instrument 120, and the processing is finished.

Figure 6A:
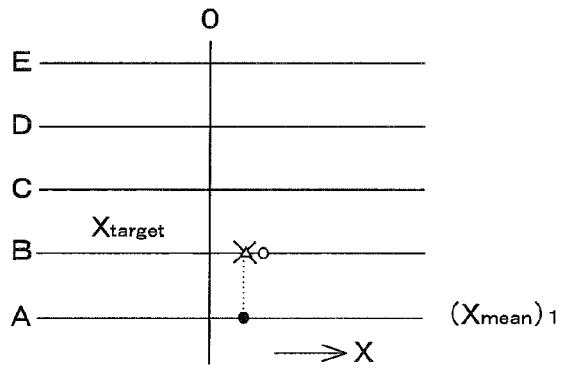
FIGS. 6A to 6D are views showing a state of variation of a targeted transfer position determined in the analytical processing.

FIGS. 6A to 6D show an example of a state in which an actual transfer position varies with respect to targeted transfer position $X_{target}$ that have been computed by the above-described analytical processing. In FIGS. 6A to 6D, a designed transfer position is shown as an origin 0. Further, in this example, targeted transfer position $X_{target}$ is computed without taking other processes into consideration. In FIG. 6A, an actually measured transfer position measured by measurement/inspection instrument 120 in a first process A is indicated by a black circle. According to the formula (1) (assuming $\rho=0$), a targeted transfer position in a process B (indicated by x in FIG. 6A) is located at the same position as the black circle. Further, in FIG. 6A, an actual transfer position of a pattern that has been transferred according to the targeted transfer position is indicated by a white circle.

Figure 6B:
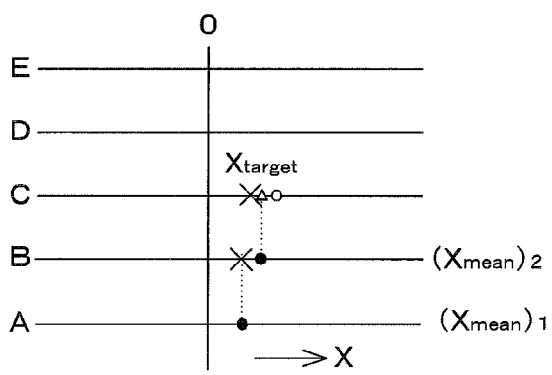
Figure 6C:
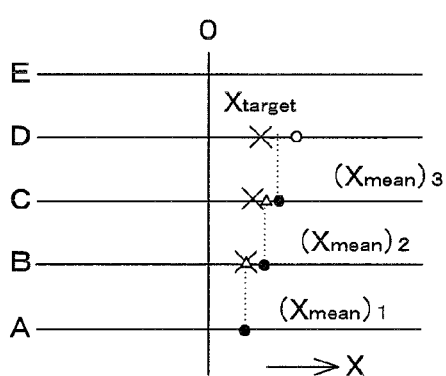
Figure 6D:
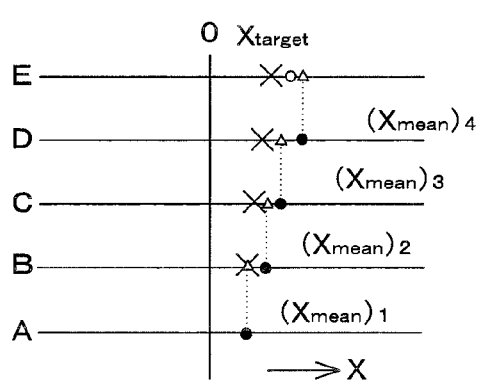

Afterward, as shown in FIGS. 6B, 6C and 6D, if the weights of the respective processes are assumed to be the same, targeted transfer position $X_{target}$ indicated by x in processes C, D and E is located at a moderate position with which its deviation is minimized with respect to the actual transfer position (indicated by a black circle) in the earlier processes measured by measurement/inspection instrument 120.

Incidentally, in FIGS. 6A to 6D, a targeted transfer position by default is indicated by a triangle. As shown in FIGS. 6A to 6D, only the immediately lower layer serves as a reference layer in processes B to E, and therefore a position corresponding to the actual transfer position of the immediately lower layer serves as a targeted transfer position. Here, in the case where exposure apparatus 100 has a characteristic that the transfer position is deviated to +X or the like, the actual transfer position is deviated further to +X as the transfer is performed to the upper layers. As can be seen when viewing FIGS. 6A to 6D together, the deviation of the actual transfer position in processes A to E is kept within a narrow range.

Incidentally, although a position $X_{target}$ of a target layer (a layer to be exposed next time) is computed in the analytical processing shown in the flowchart in FIGS. 4 and 5, analytical apparatus 500 can also analyze overlay deviation in the present process not using a layer to be exposed next time, but using a layer of the present process as a target layer, in the method similar to the above-described method. That is, whether or not the actually measured transfer position measured by measurement/inspection instrument 120 falls within a permissible range based on a reference position computed using the transfer positions of the preceding layers can be checked. In this case, in the above formula (1), reference position $X_{target}$ of a permissible range of overlay error in the present process may be computed, assuming that a layer in the present process in which a resist image is formed is a resist layer and $(X_{mean})_i$ is an actually measured transfer position in a plurality of other layers. In this case, in the formula (1), $\rho$ may be equal to zero ($\rho=0$), but in the cases other than $\rho=0$, an actually measured linewidth measured by measurement/inspection instrument 120 can be used as target linewidth $W_{target}$.

Figure 7A:
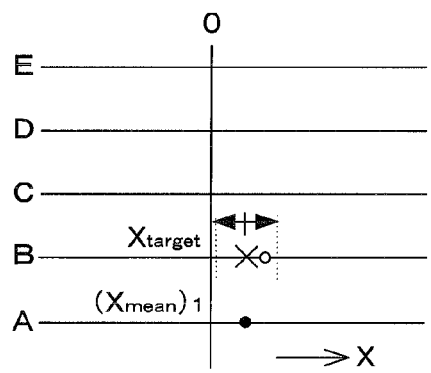
FIGS. 7A to 7D are views showing a state of overlay error check.
Figure 7B:
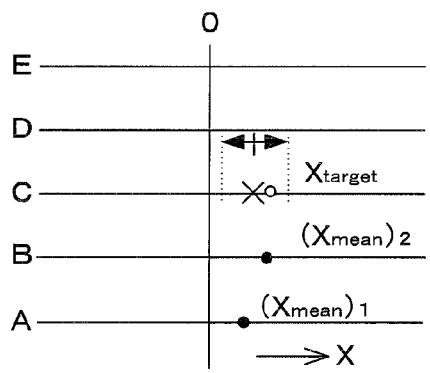
Figure 7C:
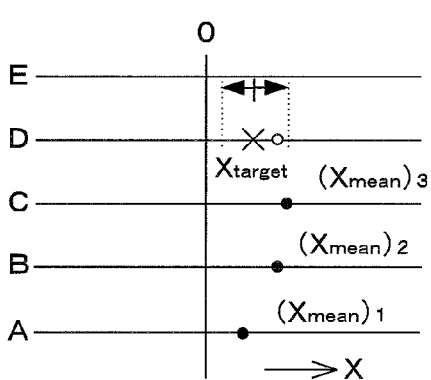
Figure 7D:
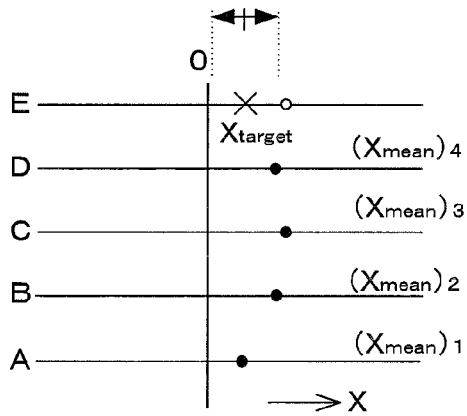

FIGS. 7A to 7D model an example of a state of check of a permissible range of the actually measured transfer position measured by measurement/inspection instrument 120 when five processes A to E are executed. In FIG. 7A, a targeted transfer position measured by measurement/inspection instrument 120 in a first process A is indicated by a black circle. According to the formula (1) (assuming $\rho=0$), a reference position in a process B (indicated by x in FIG. 7A) is located at the same position as the black circle. Afterward, as shown in FIGS. 7B to 7D, if the weights of the respective processes are assumed to be the same, the reference position in processes C, D and E is located at a moderate position with which its deviation is minimized with respect to the actual transfer position in the earlier processes measured by measurement/inspection instrument 120. As shown in FIGS. 7B and 7C, the actual transfer position indicated by a white circle is within a permissible range respectively in both processes C and D, but as shown in FIG. 7D, the actual transfer position is outside a permissible range in process E, and therefore overlay error is detected.

In the case where overlay error is detected, various measures can be taken. For example, the alignment-related parameter and/or the control system parameter may be optimized only after the overlay error is detected, or the place where abnormality of overlay is detected is stored and the place may be excluded from the subject of subsequent processing (defect inspection of the pattern or inspection of a foreign substance adhering on the pattern) by the chip, the shot, the wafer or the lot as a unit. By which unit the place should be excluded from the subject of subsequent processing can be determined according to the occurrence frequency of the overlay error.

Further, in accordance with the occurrence frequency of overlay error, the number of times of measurement/inspection in measurement/inspection instrument 120, that is, the number of times of the measurement of the overlay error and linewidth error and the optimization processing of the parameters may be gradually decreased, for example, from every fourth wafer, to every eleventh wafer, and to only a wafer at the head of a lot, or in the case where abnormality occurs, the number of times may be increased conversely.

Incidentally, the flowchart shown in FIGS. 4 and 5 is a flowchart in which analysis of overlay is mainly performed, but in analytical apparatus 500, analysis of linewidth may also be performed. In such a case, a target value of linewidth in an exposure process to be performed next time is computed, so that evaluation function $\Phi$ in accordance with the product sum of the difference between a linewidth targeted value and a linewidth actually measured value in the respective processes (exposure processes performed so far to the current wafer, or exposure processes performed of the next and subsequent times to other wafers) is minimized. Then, based on the computed linewidth targeted value, each control system parameter for exposure dose/synchronous accuracy/focus related to linewidth deviation will be optimized. The table showing a correlation between exposure dose error, synchronous accuracy error and focus error, and the linewidth is registered in analytical apparatus 500, and the control system parameter with which a desired linewidth can be obtained can be calculated back by referring to the table.

Figure 8:
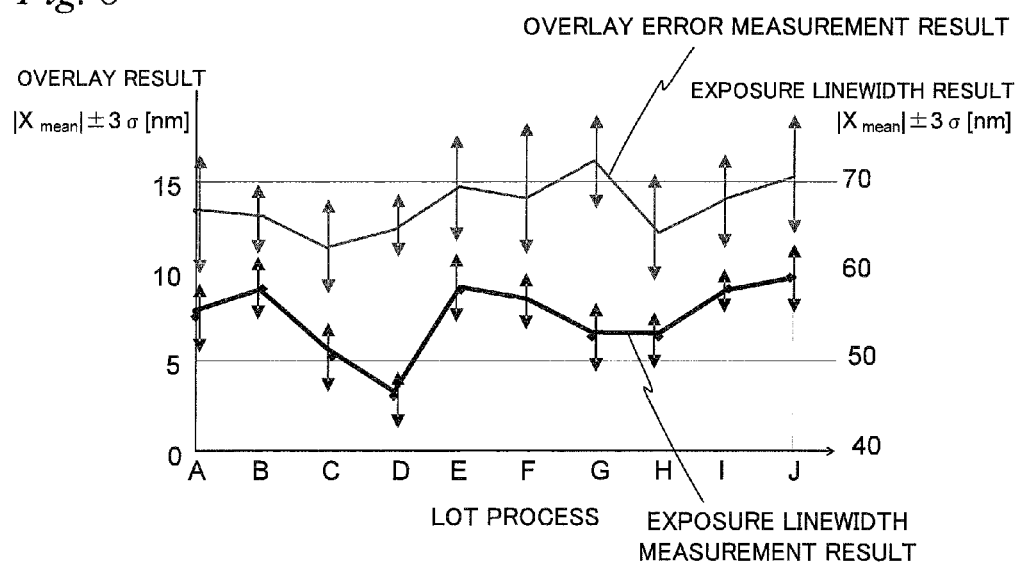
FIG. 8 is a graph showing variation of overlay error and linewidth error relating to a plurality of layers.

As is described above, information obtained in the past can be used in the above-described computation of targeted transfer position and targeted linewidth, and error check. FIG. 8 shows an example of a graph showing variation in overlay error and linewidth in processes A to J that have been obtained in the past. In this graph, overlay error and linewidth error are shown in a sequential line graph, and a magnitude of standard deviation (3σ) is indicated by a vertical two-headed arrow. The overlay error and the linewidth in each process can be used as $(X_{mean})_i$ in the above formula (1). Further, 3σ of the overlay error and the linewidth in each process can be used as the threshold value in steps 315 and 321 in FIGS. 4 and 5, or as a permissible range in the permissible range check. That is, although the permissible range is constant in the embodiment, the permissible range may be the value that is obtained by judging 3σ of the overlay error obtained in the past.

Incidentally, analytical apparatus 500 can display information on the measurement result obtained from measurement/inspection instrument 120 and the targeted transfer position or the targeted linewidth computed in the foregoing analytical processing, and the like. For example, analytical apparatus 500 can display the relation between the targeted transfer position and the actual transfer position as shown in FIGS. 6A to 6D and the relation between the actually measured transfer position and the permissible range of overlay error as shown in FIGS. 7A to 7D as they are. By viewing the display, the operator that manages the device manufacturing can confirm whether or not these transfer positions or permissible ranges are proper for a plurality of layers.

Further, the relation between the targeted transfer position and the actual transfer position and the relation between the actually measured transfer position and the permissible range of overlay error, and the like can also be displayed in a form similar to the graph shown in FIG. 8.

Figure 9:
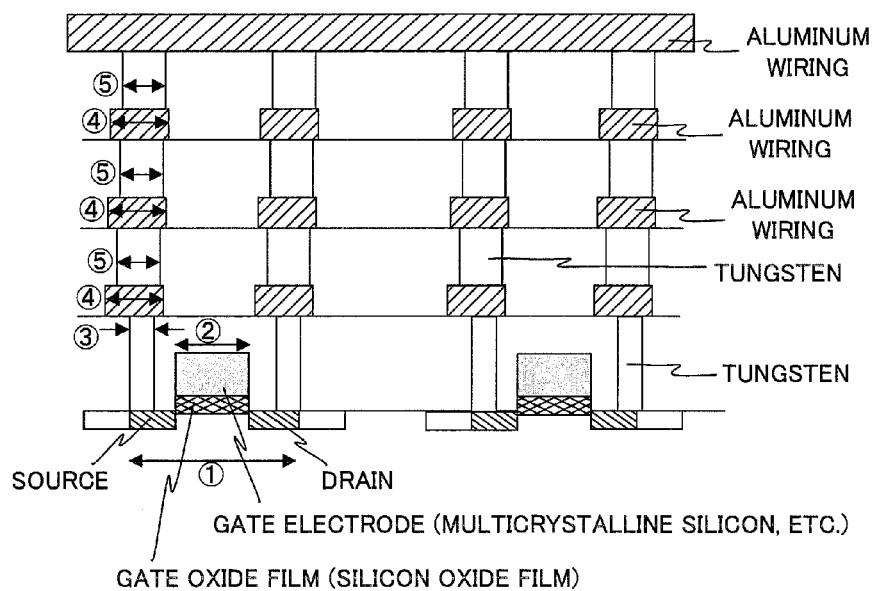
FIG. 9 is a view showing an example of a graphic image of a cross section of a device which is displayed.

Further, as shown in FIG. 9, a view can be displayed in which the overlay and the linewidth are reflected in a cross-sectional view of an actual device. FIG. 9 shows a cross section of a device that is configured of five layers (one device layer and five wiring layers). In the indicated widths of a gate oxide film, a gate electrode, a source, a drain, a gate, a silicon oxide film, and tungsten (the widths indicated by two-headed arrows 1 to 5 in FIG. 9) shown in the cross-sectional view, in addition to the designed values thereof, targeted transfer position $X_{target}$ and targeted linewidth $W_{target}$ are reflected. That is, by viewing this graphic image, the deviation state among the layers, the sizes of the respective constituents and the like can be confirmed in a form close to an actual device structure.

Each of these displays processing conditions such as the targeted transfer positions and the permissible values relating to a plurality of layers, and the comparison of the processing conditions among the layers can be performed without difficulty.

Further, according to these displays, along with the determined processing conditions, the default processing conditions can also be displayed for comparison. A simultaneous display of the positions indicated by triangles and the targeted positions in FIGS. 6A to 6D corresponds to such a display. Further, a linewidth comparison display in step 317 of FIG. 4 and a transfer position comparison display in step 323 of FIG. 5 also correspond to such a display. Further, regarding the device cross section shown in FIG. 9, a cross-sectional view according to the designed values and a cross-sectional view under the processing conditions determined in the analytical processing can also be displayed simultaneously.

Further, together with the processing conditions of each layer, the processing results according to the processing conditions can also be displayed simultaneously. For example, in FIGS. 6A to 6D, targeted transfer positions $X_{target}$ indicated by x and the actual transfer positions indicated by black circles are displayed simultaneously.

SUMMARY

As is described above in detail, according to the embodiment, when determining the processing conditions with respect to device patterns and the like that are formed and layered on a wafer in each process, for example, the alignment-related parameter and the control system parameter for realizing the targeted transfer position and the targeted linewidth in exposure apparatus 100, data on a forming state of the device patterns and the like in the process relating to a plurality of layers that has been executed in the past, for example, data on the actual transfer positions of the patterns relating to a plurality of layers that were already formed on the wafer is used, and therefore, a pattern of a layer subject to the processing can be made well-balanced and proper with respect to the forming states of the patterns in the process relating to a plurality of layers.

Incidentally, as the processing conditions determined in this method, besides the alignment-related parameters and the control system parameters in exposure apparatus 100, for example, parameters related to permissible value check of overlay error in measurement/inspection instrument 120 are also included. That is, the range determined by the overlay deviation in each process performed so far is determined as the permissible range of overlay of the present process. With this operation, the permissible value check taking the overlay deviation relating to a plurality of layers into consideration can be performed.

Further, in such a case, as with ρ in the above formula (1), not only the overlay error but also the linewidth deviation can be taken into consideration, as data on the forming states of the device patterns and the like in the process relating to a plurality of layers executed in the past.

Further, according to the embodiment, data, which can be used as data on the forming states of the device patterns and the like in the process relating to a plurality of layers executed in the past, is data on overlay or linewidth of the patterns relating to a plurality of layers already formed on a wafer that is subject to processing, but in addition, data on overlay or linewidth in a process corresponding to formation of the device pattern to be layered on the wafer from now, among the processes executed to other wafers, that is, in the same process performed to other wafers can also be used. By using such data, all data empirically obtained for that process can be effectively utilized when the processing conditions for a wafer to which that process is to be executed are determined.

Further, when the processing conditions with respect to the device pattern of each layer are determined taking into consideration data on the forming states of the patterns in the process relating to a plurality of layers, the weight of data regarding overlay deviation and linewidth deviation of each of a plurality of layers can be individually set. With this individual setting, the weight can be set heavier for layers such as a layer having a strong relation with the current layer (e.g. a layer electrically connected via a contact hole or the like, a layer on which an alignment mark used at the time of alignment measurement is formed, or the like), and a layer for which critical accuracy is required; and the weight can be set lighter for layers such as a layer having a weak relation, and a layer for which the required accuracy is not strict relatively. For example, assuming that the weight for the layer having a weak relation, the layer for which the required accuracy is not strict relatively or the like is zero, the processing conditions with respect to the device pattern of each laser can be determined only for the layer having a strong relation.

Incidentally, in the case where the determined processing condition is the permissible value of overlay deviation that is measured in measurement/inspection instrument 120, the permissible value can be determined taking the thickness of each layer into consideration. Information on the thickness of each layer is included as design information in the exposure recipe. For example, if the layer is thick, then in some cases, the overlay error is not enough to affect the device operation even when the overlay error has the same quantity, and in such cases, it is more desirable to take the thickness into consideration when setting the weight. For example, in the case where a contact hole is formed through an insulation film between the layers, it is desirable to also take the thickness of the insulation film into consideration when setting the weight. In this manner, by taking the thickness into consideration when setting the weight, the permissible value becomes a spatially well-balanced and proper permissible value in which a layering direction of the device is also taken into consideration.

Further, in the embodiment, in analytical apparatus 500, the weight setting screen is displayed, and the weight setting value of each layer can be input via a man-machine interface, but the setting value may be set in advance, or as is described above, may be automatically computed based on design data included in the exposure recipe that includes the thickness described above.

Further, according to the embodiment, the alignment-related parameters and the control system parameters that affects the device pattern transfer state in exposure apparatus 100, that is, the exposure dose control system parameter of illumination light for exposure used to transfer device patterns on a wafer, the focus control system parameter of the projection optical system (projection lens) that projects the device patterns on the wafer, the control system parameter related to synchronous control deviation between the device patterns and the wafer, and the like are optimized, but other parameters may also be controlled as far as they are parameters that affect the overlay or the linewidth. That is, the parameters to be adjusted are not limited in the present invention. Further, the parameters to be adjusted may be limited in advance taking the arithmetic capacity of analytical apparatus 500.

Incidentally, the optimization of parameters and the like do not have to be based on the measurement result of measurement/inspection instrument 120, and the optimization of parameters can also be performed based on the estimation values which are obtained by estimating linewidth error, overlay error and the like from the trace data of exposure dose/synchronous control/focus acquired during exposure, the EGA measurement result, the EGA computation result and the like, using the alignment simulator and the linewidth simulator.

Further, according to the embodiment, in order to determine the reference position of the permissible range of the transfer position, the linewidth is also taken into consideration. By doing so, it becomes possible to flexibly adjust a permissible degree of overlay error. Also, it becomes possible to realize the process that accords with the required accuracy of each layer. Reversely, in order to adjust the permissible range of linewidth, the overlay error may be taken into consideration as a matter of course.

Further, according to the embodiment, in the case where a targeted transfer position, a targeted linewidth or the like exceeds the threshold value and becomes greatly different from the default setting value, the confirmation screen for determining whether the targeted transfer position, the targeted linewidth or the like is right or wrong is displayed. With this display, the operator can confirm whether the targeted transfer position or the targeted linewidth is proper or not. In this case, it goes without saying that the operator can more easily confirm by a default transfer position, linewidth or the like (in design) being displayed together with the targeted transfer position, the targeted linewidth or the like.

Further, in the embodiment, the posterior measurement by measurement/inspection instrument 120, and the determination of processing conditions in which the forming states of device patterns of a plurality of layers in the past are taken into consideration do not have to be performed for every layer. By measuring the overlay error or the linewidth error of the patterns formed on a wafer according to the determined processing conditions, and increasing or decreasing the frequency at which the posterior measurement and/or the processing condition is/are determined, based on the measurement result, unnecessary measurement or computation can be prevented from being performed, and therefore the productivity of devices is improved. Incidentally, the measurement frequency of the anterior measurement by measurement/inspection instrument 120 can also be increased or decreased similarly.

Further, in the embodiment, for a wafer in which abnormality has been detected can be excluded from the processing subject of subsequent inspection processing and the like, by the portion where the abnormality has been detected, or by the chip, the shot, the wafer or the lot as a unit. With this operation, defect of the wafer is immediately detected and the efficiency of the process is realized.

Further, in the embodiment, the parameters of exposure apparatus 100 are optimized in analytical apparatus 500, but the measurement/inspection conditions in measurement/inspection instrument 120 may also be optimized as a matter of course. After such optimization, the measurement/inspection is performed under the optimized measurement/inspection conditions, and accordingly the measurement accuracy is improved.

Further, in the embodiment, optimization of the processing conditions may be performed only in the case where the measurement/inspection result in measurement/inspection instrument 120 is abnormal. Further, not only the number of times of optimization of the processing conditions but also the number of times of measurement of measurement/inspection instrument 120 may be increased or decreased in accordance with the occurrence frequency of abnormality in the measurement/inspection result. Further, in the embodiment, in accordance with such occurrence frequency of abnormality in the measurement/inspection result, the number of times of inspection of defect of the device pattern of each layer or a foreign substance adhering on the pattern can also be increased or decreased with respect to shot(s), wafer(s) within a lot, or lot(s) as a unit. With this operation, occurrence of unnecessary processing can be reduced.

Further, in the embodiment, the evaluation function is the product sum of the deviation between a targeted transfer position in an exposure process performed this time and a transfer position in other processes, but the evaluation function may be the square sum of the deviation between a targeted transfer position in an exposure process performed this time and a transfer position in other processes.

Further, according to the embodiment, information on the processing conditions that were dynamically changed for each layer with respect to patterns of a plurality of layers already layered on the object is displayed for a plurality of layers. With such display, the operator can visually confirm that the processing conditions of each layer, which were dynamically determined taking into consideration the forming states of patterns of a plurality of preceding and succeeding layers, are proper.

Further, according to the embodiment, in this display, information on the dynamically changed processing conditions and information on default processing conditions are simultaneously displayed, or together with processing conditions of each layer, information on result of processing that was executed according such processing conditions is also displayed simultaneously, which allows the properness of the processing conditions to be more easily confirmed from the multifaceted viewpoint.

Further, in the embodiment, such determination and display of processing conditions are performed by analytical apparatus 500, but they may be performed by measurement/inspection instrument 120, or by exposure apparatus 100, management controller 160, host 600, or the like.

Further, in the embodiment, exposure apparatus 100, C/D 110 and measurement/inspection instrument 120 are inline connected. When various apparatuses are inline connected in this manner, the wafer process can be streamlined. However, these apparatuses may also be offline as is described earlier.

Further, from another viewpoint, the device manufacturing system according to the embodiment can be regarded as a system that has a data management section that performs overall management of information on the forming states of patterns in the process relating to a plurality of layers executed in the past. When such data management section is equipped, the overall management of processing conditions in a plurality of processes can be performed.

The determination and display of processing conditions described above are realized by an information processor, that is, a computer executing a software program in which the processing procedures are described. Such software program is downloaded via communication network such as internet, in-house LAN (intranet) or the like and installed in the computer, or installed in the computer via a recording medium such as an optical disk, that is, an information recording medium or the like.

Besides the process of transferring a device pattern on a glass plate, the manufacturing process of thin film magnetic heads, the manufacturing process of imaging devices (such as CCDs), micromachines, organic ELs, DNA chips and the like, the present invention can naturally be applied to process management (linewidth management, overlay management) in all the device manufacturing processes.

Further, the present invention can also be applied to a liquid crystal substrate manufacturing system that manufactures a liquid crystal display device by processing a substrate such as a glass plate. Further, not limited to the liquid crystal display device, the present invention can also be applied to the manufacturing process of displays of other types.

The present invention can also be applied to the device manufacturing process other than the exposure process as far as a device pattern is formed layer by layer on a substrate in such a device manufacturing process.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A processing condition determining method comprising:
a determination process of determining, using an information processor, a processing condition for a pattern of a layer to be formed on an object during a lithography exposure process;
a measurement process of measuring at least one of occurrence frequency of overlay error and linewidth error between a target linewidth and a measured linewidth of a pattern that has been formed on the object according to the processing condition determined in the determination process; and
a process of obtaining frequency at which the determination process and the measurement process are performed, in accordance with the at least one of occurrence frequency of overlay error and linewidth error between a target linewidth and a measured linewidth of the pattern measured in the measurement process;
wherein the processing condition is determined based on information on a forming state of a pattern previously formed on at least one of
a plurality of layers that have been already formed on the object, and
a plurality of layers that have already been formed on another object.

2. The processing condition determining method according to claim 1, wherein
when the processing condition is determined, at least one of overlay deviation and linewidth deviation of each layer of a plurality of layers is weighted.

3. The processing condition determining method according to claim 2, wherein
in accordance with relevance with a device pattern layer for which the processing condition is determined, a weight of each layer of a plurality of layers is determined.

4. The processing condition determining method according to claim 2, wherein
a weight of the each layer is determined taking thickness of the layer into consideration.

5. The processing condition determining method according to claim 2, wherein
information on the weight of the each layer is input in the information processor via a man-machine interface.

6. The processing condition determining method according to claim 1, wherein
the exposure process includes forming the pattern by transfer on the object, and
the processing condition includes a condition related to alignment of the pattern and the object in the exposure process.

7. The processing condition determining method according to claim 6, wherein
the condition related to alignment includes a condition related to a targeted transfer position of the pattern.

8. The processing condition determining method according to claim 1, wherein
the exposure process forms the pattern by transfer on the object, and
the processing condition includes a transfer condition of the pattern in the exposure process.

9. The processing condition determining method according to claim 8, wherein the transfer condition includes at least one of
a condition related to energy of an energy beam used to transfer the pattern onto the object, a condition related to focus of an optical system that projects the pattern on the object, a condition related to synchronous control of a stage on which the pattern is mounted and a stage on which the object is mounted, and a condition related to relative positional deviation between the pattern and the object.

10. The processing condition determining method according to claim 1, wherein
the processing condition includes information on a permissible value of at least one of overlay deviation and linewidth deviation of a pattern of a layer that is subject to the exposure process.

11. The processing condition determining method according to claim 10, wherein
the information on a forming state of a pattern includes at least one of information on overlay of a pattern relating to a plurality of layers, and information on linewidth of the pattern relating to a plurality of layers, and
the information on a permissible value of at least one of overlay deviation and linewidth deviation is determined, at least taking into consideration information on deviation relating to a plurality of layers of at least one of the information on overlay and the information on linewidth.

12. The processing condition determining method according to claim 1, wherein
in the case where the determined processing condition is different from a default processing condition, the information processor displays the determined processing condition via a man-machine interface.

13. The processing condition determining method according to claim 12, wherein
the determined processing condition is displayed together with the default processing condition.

14. A processing condition determining apparatus that determines a processing condition with respect to a pattern that is formed and layered on an object, using the processing condition determining method according to claim 1.

15. A processing apparatus that executes a process of forming a pattern on an object, the apparatus comprising:
the processing condition determining apparatus according to claim 14.

16. A measurement apparatus that measures information on a pattern formed on an object, the apparatus comprising:
the processing condition determining apparatus according to claim 14.

17. An exposure apparatus that transfers a pattern onto an object, the apparatus comprising:
the processing condition determining apparatus according to claim 14.

18. A substrate processing system comprising:
a determination section that determines a processing condition of a pattern to be formed on an object during a lithography exposure process;
a measurement section that measures at least one of occurrence frequency of overlay error and linewidth error between a target linewidth and a measured linewidth of a pattern that has been formed on the object according to the processing condition determined by the determination section; and
a processing section that obtains frequency at which the determination section determines and the measurement section measures, in accordance with the at least one of occurrence frequency of overlay error and linewidth error between a target linewidth and a measured linewidth of the pattern measured by the measurement section;
wherein the processing condition is determined based on information on a forming state of a pattern previously formed on at least one of
a plurality of layers that have been already formed on the object, and
a plurality of layers that have already been formed on another object.

19. A non-transitory computer-readable medium storing thereon a program that, when executed by a computer, causes the computer to perform:
a determination process of determining a processing condition for a pattern of a layer to be formed on an object during a lithography exposure process;
a measurement process of measuring at least one of occurrence frequency of overlay error and linewidth error between a target linewidth and a measured linewidth of a pattern that has been formed on the object according to the processing condition determined in the determination process; and
a process of obtaining frequency at which the determination process and the measurement process are performed, in accordance with the at least one of occurrence frequency of overlay error and linewidth error between a target linewidth and a measured linewidth of the pattern measured in the measurement process;
wherein the processing condition is determined based on information on a forming state of a pattern previously formed on at least one of
a plurality of layers that have been already formed on the object, and
a plurality of layers that have already been formed on another object.

20. The non-transitory computer-readable medium according to claim 19, wherein
when the processing condition is determined, at least one of overlay deviation and linewidth deviation of each layer of a plurality of layers is weighted.

21. The non-transitory computer-readable medium according to claim 20, wherein, in accordance with relevance with a device pattern layer for which the processing condition is determined, the program, when executed by the computer, causes the computer to perform:
determining a weight of each layer of a plurality of layers.

22. The non-transitory computer-readable medium according to claim 20, wherein
a weight of the each layer is determined taking thickness of the layer into consideration.

23. The non-transitory computer-readable medium according to claim 20, wherein the program, when executed by the computer, causes the computer to further perform:
a process of inputting information on the weight of the each layer via a man-machine interface.

24. The non-transitory computer-readable medium according to claim 19, wherein
the exposure process forms the pattern by transfer on the object, and
the processing condition includes a condition related to alignment of a pattern of a layer that is subject to processing and the object.

25. The non-transitory computer-readable medium according to claim 24, wherein
the condition related to alignment includes a condition related to a targeted transfer position of the pattern.

26. The non-transitory computer-readable medium according to claim 19, wherein
the exposure process forms the pattern by transfer on the object, and
the processing condition includes a transfer condition of a pattern of a layer that is subject to processing.

27. The non-transitory computer-readable medium according to claim 26, wherein the transfer condition includes at least one of
a condition related to energy of an energy beam used to transfer the pattern onto the object, a condition related to focus of an optical system that projects the pattern on the object, a condition related to synchronous control of a stage on which the pattern is mounted and a stage on which the object is mounted, and a condition related to relative positional deviation between the pattern and the object.

28. The non-transitory computer-readable medium according to claim 19, wherein
the processing condition includes information on a permissible value of at least one of overlay deviation and linewidth deviation of a pattern of a layer that is subject to processing.

29. The non-transitory computer-readable medium according to claim 28, wherein
the information on a forming state of a pattern includes at least one of information on overlay of a pattern relating to a plurality of layers, and information on linewidth of the pattern relating to a plurality of layers, and
the information on a permissible value of at least one of overlay deviation and linewidth deviation is determined, at least taking into consideration information on deviation relating to a plurality of layers of at least one of the information on overlay and the information on linewidth.

30. The non-transitory computer-readable medium according to claim 19, wherein, in the case where the determined processing condition is different from a default processing condition, the program, when executed by the computer, causes the computer to perform:
   displaying the determined processing condition via a man-machine interface.

31. The non-transitory computer-readable medium according to claim 30, wherein
   the determined processing condition is displayed together with the default processing condition.

32. The non-transitory computer-readable medium according to claim 19, wherein
   at least a part of the object on which the abnormality has been detected in the detection process is excluded from a subsequent processing subject in a predetermined unit of processing.

33. A method comprising:
   a determination process of determining, using an information processor, a processing condition for a pattern of a layer to be formed on an object during a lithography exposure process, the processing condition being determined based on information on a forming state of a pattern previously formed on at least one of
      a plurality of layers that have been already formed on the object, and
      a plurality of layers that have already been formed on another object;
   a measurement process of measuring at least one of overlay error and linewidth error of a pattern that has been formed on the object according to the processing condition determined in the determination process;
   a process of obtaining frequency at which the determination process and the measurement process are performed, in accordance with the at least one of overlay error and linewidth error measured in the measurement process; and
   a detection process of detecting, based on a comparison of a measurement result of the measurement process and a threshold value, at least one of overlay abnormality and linewidth abnormality of a pattern of the layer that is subject to processing;
   wherein the determination process is performed only in the case where said at least one of overlay abnormality and linewidth abnormality has been detected by the detection process.

34. The method according to claim 33, wherein,
   when the at least one of overlay abnormality and linewidth abnormality of the pattern of the layer that is subject to processing is detected in the detection process, at least part of the layer is excluded from a subsequent processing subject in a predetermined unit of processing.

35. The method according to claim 33, wherein
   in accordance with occurrence frequency of the at least one of overlay abnormality and linewidth abnormality detected in the detection process, a number of times of inspection of defect is increased or decreased.

36. A non-transitory computer readable medium storing thereon a computer program that, when executed by a computer, causes the computer to perform:
   a determination process of determining, using an information processor, a processing condition for a pattern of a layer to be formed on an object during a lithography exposure process, the processing condition being determined based on information on a forming state of a pattern previously formed on at least one of
      a plurality of layers that have been already formed on the object, and
      a plurality of layers that have already been formed on another object;
   a measurement process of measuring at least one of overlay error and linewidth error of a pattern that has been formed on the object according to the processing condition determined in the determination process;
   a process of obtaining frequency at which the determination process and the measurement process are performed, in accordance with the at least one of overlay error and linewidth error measured in the measurement process; and
   a detection process of detecting, based on a comparison of a measurement result of the measurement process and a threshold value, at least one of overlay abnormality and linewidth abnormality of a pattern of the layer that is subject to processing;
   wherein the determination process is performed only in the case where said at least one of overlay abnormality and linewidth abnormality has been detected by the detection process.

* * * * *